United States Patent [19]
Wakasugi et al.

[11] Patent Number: 5,742,540
[45] Date of Patent: Apr. 21, 1998

[54] SEMICONDUCTOR MEMORY AND LAYOUT/CIRCUIT INFORMATION GENERATING APPARATUS

[75] Inventors: Hirohiko Wakasugi; Hideshi Maeno, both of Tokyo, Japan

[73] Assignee: Mitsubishi Denki Kabushiki Kaisha, Tokyo, Japan

[21] Appl. No.: 785,826

[22] Filed: Jan. 15, 1997

[30]   Foreign Application Priority Data

Jan. 30, 1996 [JP] Japan ................................. 8-014279
Sep. 5, 1996 [JP] Japan ................................. 8-235052

[51] Int. Cl.$^6$ ................................................ G11C 16/00
[52] U.S. Cl. ................................................ 365/104; 365/94
[58] Field of Search ................................. 365/104, 103, 365/94, 63, 72; 257/390

[56]   References Cited

U.S. PATENT DOCUMENTS 4,773,047  9/1988  Uchino et al. ........................ 365/104
5,517,061  5/1996  Azmanov ............................... 365/104

FOREIGN PATENT DOCUMENTS 5-48053   2/1993  Japan .
6-283691  10/1994  Japan .

*Primary Examiner*—Tan T. Nguyen
*Attorney, Agent, or Firm*—Burns, Doane, Swecker & Mathis, LLP

[57]   ABSTRACT

NMOS transistors which are provided adjacently to each other in the direction of the formation of bit lines between word lines are paired. The drains of the NMOS transistors are connected in common through a common node to form a memory cell. Between the common node and the bit line is provided a region where a contact is placed. Furthermore, regions where the contact is placed in the respective NMOS transistors are provided on a layout. By these combinations, data are stored.

9 Claims, 19 Drawing Sheets

5,742,540

SEMICONDUCTOR MEMORY AND LAYOUT/CIRCUIT INFORMATION GENERATING APPARATUS

BACKGROUND OF THE INVENTION

1. Field of the Invention

The present invention relates to a semiconductor memory, and more particularly to a mask ROM using a MOS transistor for a memory cell.

2. Description of the Background Art

In a mask ROM having a so-called contact method in which data are stored depending on the presence of a contact at the contact step, the contact step is performed after the field step differently from a mask ROM having a field method which depends on whether or not ion implantation is performed at the field step, for example. Consequently, there is an advantage that data can be determined later.

FIG. 20 is a circuit diagram showing the structure of a memory cell array which is used for the mask ROM having a contact method according to the prior art. This example shows a memory cell pair which stores 2-bit information by NMOS transistors (hereinafter referred to as "NTr") 1 and 2. The gate terminals of the NTrs 1 and 2 are connected to word lines WL1 and WL2, respectively. The source terminals of the NTrs 1 and 2 are connected to a GND wiring VSS to which the ground level is set.

Data are stored in the memory cell pair having a structure shown in FIG. 20 depending on whether or not a drain terminal should be connected to a bit line BL at the contact step. In other words, data are stored depending on the presence of a contact 8 for connecting a metal wiring forming a bit line to a diffusion region which forms the drain region of a transistor. In this example, if the NTr1 having the contact indicates data "1", the NTr 2 stores data "0".

The operation for reading information stored in the memory cell pair shown in FIG. 20 is performed in the following manner. First of all, a source voltage VDD is precharged in each bit line by a precharge circuit before reading the information.

Then, the word line WL having an address in which data should be read out is set to the "H" level (VDD level). If the drain terminal of the NTr of a memory cell in which a gate terminal is connected to the word line WL having the "H" level is connected to the bit line BL through the contact 8, the NTr is brought into the ON state so that the bit line BL is discharged to the "L" level (ground level). If the same drain terminal is not connected to the bit line BL through the contact 8, the bit line BL keeps the "H" level because the NTr is electrically disconnected from the bit line BL. More specifically, "1"/"0" is stored depending on the presence of the drain-contact 8 of the selected NTr. In this case, it is sufficient that the data can be distinguished as "1"/"0". Therefore, "1"/"0" of the data may be caused to correspond to "1"/"0" of the presence of the contact.

Most of a bit line capacity is occupied by a PN junction capacitance of a drain in a contact portion and a substrate. In this case, consequently, the bit line capacity also depends on the stored contents such as the ratio of the contact to the whole as well as the number of words. The bit line capacity influences the rise/fall speed of an output waveform and the value of the charge an Consequently, the read speed and the consumed power of the whole ROM are finally related to the stored contents.

FIGS. 21A to 21D are circuit diagrams showing other examples of a memory cell which is more improved in a ROM having the same method according to the prior art. This ROM has been disclosed in Japanese Patent Publication No. 3-105798, for example. As shown in FIGS. 21A to 21D, two memory cells (NTr 1, NTr 2) which are provided adjacently to each other between word lines WL1 and WL2 are paired and have drains connected in common through a common node N1, and the common node N1 is connected to a bit line. Depending on whether or not the source terminals of the NTrs 1 and 2 are connected to a ground GND wiring Vss, "1"/"0" is stored.

FIG. 21A shows an example in which the stored contents are "0", "0". FIG. 21B shows an example in which the stored contents are "1", "1". FIG. 21C shows an example in which the stored contents are "0", "1". FIG. 21D shows an example in which the stored contents are "1", "0". By employing a memory cell pair having such a structure, the number of common nodes N1 which are connected to one bit line BL is fixed to half of the number of word lines WL (the number of words). For this reason, the bit line capacity becomes constant irrespective of the stored contents of each memory cell.

In the memory cell, the drain—contact is shared by the NTrs 1 and 2 which are provided adjacently to each other. Consequently, it is sufficient that the number of transistors connected to the bit line is one for two NTrs. As compared with a ROM having the same number of words, if the stored contents of all the memory cells are "1", the junction capacitance which occupies most of the bit line capacity can be reduced to half of that of the ROM having the structure shown in FIG. 20. Consequently, speed is greatly increased and the consumed power is considerably reduced.

However, if the stored contents of all the memory cells are "0", the capacity of the bit line is increased more than in the ROM having the structure shown in FIG. 20. In this case, the consumed power is increased at lower speed. Thus, even though the memory cells shown in FIGS. 21A to 21D are used, it is impossible to always increase the speed and reduce the consumed power more than in the structure shown in FIG. 20 according to the prior art depending on the stored contents.

SUMMARY OF THE INVENTION

A first aspect of the present invention is directed to a semiconductor memory comprising a bit line, a first word line, a second word line, a power line for supplying a predetermined source voltage, a first transistor having a control electrode connected to the first word line, a first electrode connected to a common node, and a second electrode, and a second transistor having a control electrode connected to the second word line, a first electrode connected to the common node, and a second electrode, the first and second transistors forming a memory cell pair, wherein 2-bit information can be written to the memory cell pair by setting connection/non-connection between the common node and the bit line, and connection/non-connection between each second electrode of the first and second transistors and the power line.

A second aspect of the present invention is directed to the semiconductor memory, wherein the second electrode of at least one of the first and second transistors may be connected to the power line if non-connection is set between the common node and the bit line.

A third aspect of the present invention is directed to the semiconductor memory, further comprising a second bit line, a third transistor having a control electrode connected to the first word line, a first electrode connected to a second common node, and a second electrode, and a fourth transistor having a control electrode connected to the second word line, a first electrode connected to the second common node, and a second electrode, the third and fourth transistors forming a second memory cell pair, wherein 2-bit information can be written to the second memory cell pair by setting connection/non-connection between the second common node and the second bit line, and connection/non-connection between each of the second electrodes of the third and fourth transistors and the power line.

A fourth aspect of the present invention is directed to a semiconductor memory comprising a bit line, a first word line, a second word line, a power line for supplying a predetermined source voltage, a first transistor having a first electrode connected to a common node, a second electrode connected to the power line, and a control electrode, and a second transistor having a first electrode connected to the common node, a second electrode connected to the power line, and a control electrode, the first and second transistors forming a memory cell pair, wherein 2-bit information can be written to the memory cell pair by setting connection/non-connection between the common node and the bit line, connection/non-connection between the control electrode of the first transistor and the first word line, and connection/non-connection between the control electrode of the second transistor and the second word line, and wherein the control electrode of at least one of the first and second transistors is brought into a floating state if non-connection is set between the common node and the bit line.

A fifth aspect of the present invention is directed to the semiconductor memory, further comprising a second bit line, a third transistor having a first electrode connected to a second common node, a second electrode connected to the power line, and a control electrode, and a fourth transistor having a first electrode connected to the second common node, a second electrode connected to the power line, and a control electrode, the third and fourth transistors forming a second memory cell pair, wherein 2-bit information can be written to the second memory cell pair by setting connection/non-connection between the second common node and the second bit line, connection/non-connection between the control electrode of the third transistor and the first word line, and connection/non-connection between the control electrode of the fourth transistor and the second word line.

A sixth aspect of the present invention is directed to an apparatus for generating layout/circuit information including the circuit information and layout information of a semiconductor memory having a memory cell pair group in which memory cell pairs are arranged in a matrix having N rows ×M columns (N≧2, M≧1), the semiconductor memory being the semiconductor memory according to the first aspect of the present invention, or a semiconductor memory comprising a bit line, a first word line, a second word line, a power line for supplying a predetermined source voltage, a first transistor having a first electrode connected to a common node, a second electrode connected to the power line, and a control electrode, and a second transistor having a first electrode connected to the common node, a second electrode connected to the power line, and a control electrode, the first and second transistors forming a memory cell pair, wherein 2-bit information can be written to the memory cell pair by setting connection/non-connection between the common node and the bit line, connection/non-connection between the control electrode of the first transistor and the first word line, and connection/non-connection between the control electrode of the second transistor and the second word line, the apparatus for generating layout/circuit information comprising write information providing means for providing write information to the memory cell pair group of the semiconductor memory, memory cell array information providing means for providing memory cell array information including the number (N.M) of the memory cell pairs which form the memory cell pair group, the number (M) of bit lines, and the number (N) of first and second word lines, word line physical arrangement generating means for deciding the physical arrangement of the N first and second word lines to generate word line selection information on the basis of the write information and the memory cell array information such that capacities incidental to the M bit lines are decreased, memory cell array layout/circuit information generating means for generating memory cell array layout/circuit information which defines the circuit structure of a memory cell array including the memory cell pair group, the M bit lines, the N first and second word lines and the M power lines on the basis of the write information, the memory cell array information and the word line selection information, peripheral circuit information generating means for generating peripheral circuit information including word line selection layout/circuit information which defines a word line selecting circuit for selecting the N first and second word lines on the basis of the memory cell array information and the word line selection information, and layout/circuit information generating means for generating the layout/circuit information of the semiconductor memory on the basis of the memory cell array layout/circuit information and the peripheral circuit information.

A seventh aspect of the present invention is directed to the apparatus for generating layout/circuit information, wherein the word line physical arrangement generating means decides the physical arrangement of the N first and second word lines to generate the word line selection information such that word lines having a high degree in which write data in the same column are coincident with each other are first and second word lines in the same row.

An eighth aspect of the present invention is directed to the apparatus for generating layout/circuit information, wherein the word lines having a high degree in which the write data in the same column are coincident with each other may include word lines in which all write data in the same column are coincident with one another.

A ninth aspect of the present invention is directed to the apparatus for generating layout/circuit information, wherein the memory cell array layout/circuit information generating means converts all write data in an inverted column of M columns into inverted data to output the memory cell array layout/circuit information, and outputs an inverted column information for indicating the inverted column, the inverted column having a relatively great number of memory cell pairs both of which store data for indicating the connection between the common node and the bit line, wherein the peripheral circuit information may include bit line selection layout/circuit information which defines a bit line selecting circuit for selecting the M bit lines, and wherein the peripheral circuit information generating means may further receive the inverted column information, and output the bit line selection layout/circuit information which defines the bit line selecting circuit that can invert and output data obtained from any of the M bit lines corresponding to the inverted column to output inverted data.

According to the first aspect of the present invention, the 2-bit information can be written to the memory cell pair by setting connection/non-connection between the common node and the bit line and connection/non-connection between each second electrode of the first and second transistors and the power line. Consequently, in the case where the second electrodes of the first and second transistors are set to non-connection, non-connection is set between the common node and the bit line.

Furthermore, the first electrodes are connected in common through the common node between the first and second transistors. Consequently, in the case where the bit line is connected to the common node, it is sufficient that the number of the first electrodes of the transistors connected to the bit lines is one for two transistors.

As a result, non-connection is set between the common node and the bit linen depending on the content of the 2-bit information written to the memory cell pair. Consequently, the capacity which is incidental to the bit line can be decreased more. Thus, a semiconductor memory can be obtained in which the speed is increased and the consumed power is reduced without a deterioration caused depending on the stored contents.

According to the second aspect of the present invention, in the case where non-connection is set between the common node and the bit line, the second electrode of at least one of the first and second transistors is connected to the power line. Consequently, the capacity which is incidental to the power line can be increased so that a malfunction hardly occurs even though a predetermined source voltage fluctuates.

According to the third aspect of the present invention, a power line is shared by the first to fourth transistors of the first and second memory cell pairs. Consequently, the number of the transistors connected to the power line can be increased and the capacity which is incidental to the power line can be increased so that a malfunction hardly occurs even though a predetermined source voltage fluctuates.

According to the fourth aspect of the present invention, the 2-bit information can be written to the memory cell pair by setting connection/non-connection between the common node and the bit line, connection/non-connection between the control electrode of the first transistor and the first word line, and connection/non-connection between the control electrode of the second transistor and the second word line. Consequently, in the case where non-connection is set, respectively, between the control electrode of the first transistor and the first word line, and between the control electrode of the second transistor and the second word line, non-connection is set between the common node and the bit line.

As a result, non-connection is set between the common node and the bit line so that the capacity which is incidental to the bit line can be decreased. Thus, a semiconductor memory can be obtained in which the speed is increased and the consumed power is reduced.

According to the fifth aspect of the present invention, the power line is shared by the first to fourth transistors of the first and second memory cell pairs. Consequently, the number of the transistors connected to the power line can be increased and the capacity which is incidental to the power line can be increased so that a malfunction hardly occurs even though a predetermined source voltage fluctuates.

According to the sixth aspect of the present invention, the word line selection content deciding means of the layout/circuit information generating apparatus decides the physical arrangement of the N first and second word lines to output the word line selection information on the basis of the write information and the memory cell array information such that the capacities which are incidental to the M bit lines respectively are decreased. The memory cell array circuit information generating means and the peripheral circuit information generating means generate the memory cell array layout/circuit information and the peripheral circuit information on the basis of the word line selection information, respectively.

Accordingly, the semiconductor memory that is defined by the layout/circuit information which is generated by synthesizing the layout/circuit information by the layout/circuit information synthesizing means has a circuit structure in which the capacities that are incidental to the M bit lines respectively are reduced optimally based on the write information so that the speed can be increased and the consumed power can be reduced.

According to the seventh aspect of the present invention, the word line physical arrangement generating means of the layout/circuit information generating apparatus decides the physical arrangement of the N first and second word lines to output the word line selection information such that the word lines having a high degree in which the write data in the same column are coincident with each other are the first and second word lines in the same row. The memory cell array circuit information generating means and the peripheral circuit information generating means generate the memory cell array layout/circuit information and the peripheral circuit information based on the word line selection information, respectively.

Accordingly, the semiconductor memory that is defined by the layout/circuit information generated by the layout/circuit information synthesizing means has a circuit structure where the number of the memory cell pairs to which the data indicating non-connection between the common node and the bit line are written is increased and the capacities which are incidental to the M bit lines respectively are reduced in accordance with the write information so that the speed can be increased and the consumed power can be reduced.

According to the eighth aspect of the present invention, the word lines having a high degree in which the write data in the same column are coincident with each other include the word lines in which all the write data in the same column are coincident with each other.

Accordingly, the semiconductor memory defined by the layout/circuit information which is finally generated by the layout/circuit information synthesizing means has a structure that reflects the word line selection information generated by the circuit information generating apparatus according to the eighth aspect of the present invention. Consequently, the number of the memory cell pairs to which the data indicating non-connection between the common node and the bit line are written is greatly increased and the capacities that are incidental to the M bit lines respectively are reduced more. Thus, the semiconductor memory has a circuit structure in which the speed can be increased more and the consumed power can further be reduced.

According to the ninth aspect of the present invention, the memory cell array layout/circuit information generating means of the layout/circuit information generating apparatus converts all the write data in the inverted column of M columns into the inverted data to output the memory cell array layout/circuit information, and outputs the inverted column information indicating the inverted column.

In other words, in the inverted column, the memory cell pairs which store the data indicating the connection between the common node and the bit line are converted into the memory cell pairs which store the data indicating non-connection between the common node and the bit line.

The peripheral circuit information generating means further receives the inverted column information, and outputs the peripheral circuit information including the bit line selection layout/circuit information which defines the bit line selecting circuit that can invert the data obtained by any of the M bit lines corresponding to the inverted column.

Accordingly, the semiconductor memory that is defined by the layout/circuit information generated by the layout/circuit information synthesizing means has a circuit structure where the number of the memory cell pairs to which the data indicating non-connection between the common node and the bit line are written is increased and the capacities that are incidental to the M bit lines respectively are reduced in accordance with the write information so that the speed can be increased and the consumed power can be reduced.

In order to solve the above-mentioned problems, it is an object of the present invention to provide a semiconductor memory such as a ROM or the like which operates at high speed with low consumed power without a deterioration in a structure according to the prior art caused depending on the stored contents.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Embodiment>

FIGS. 1A to 1D are circuit diagrams showing the structure of a memory cell pair of a ROM according to a first embodiment of the present invention. As shown in FIGS. 1A to 1D, NTrs 1 and 2 are paired. The NTrs 1 and 2 are provided adjacently to each other in the direction of the formation of a bit line BL between two adjacent word lines WL1 and WL2. The drains of the NTrs 1 and 2 are connected in common through a common node N1 to form a memory cell. A region where a contact is placed is provided between the common node N1 and the bit line BL. In addition, regions where the contact 8 is placed in the NTrs 1 and 2 are provided on a layout. By these combinations, data are stored.

Figure 1A:
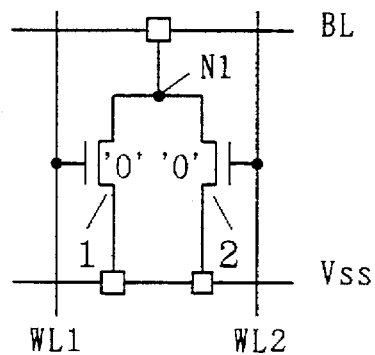
FIGS. 1A to 1D are circuit diagrams showing the structure of a memory cell pair of a ROM according to a first embodiment of the present invention.
Figure 1B:
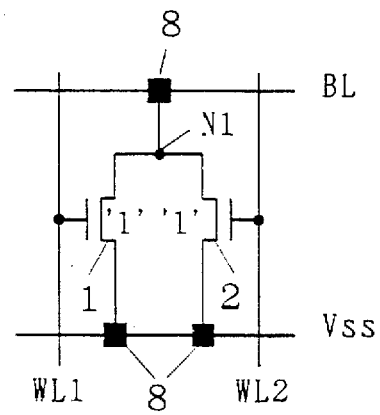
Figure 1C:
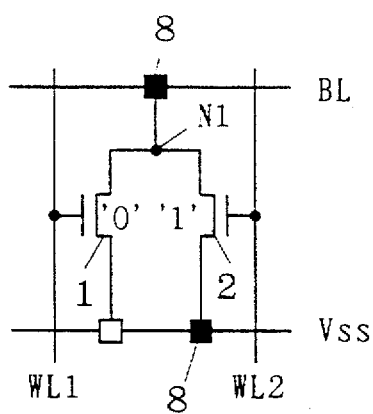
Figure 1D:
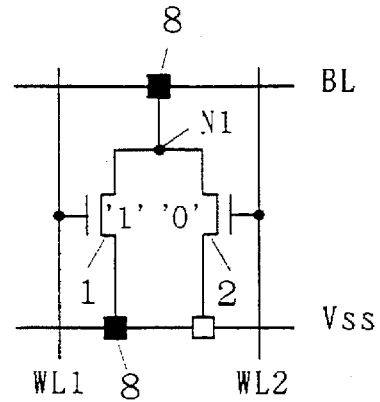

The drains of the memory cell pair are connected in common through the common node N1. For this reason, the one-unit memory cell pair distinguishes "1" "0" depending on whether or not the contact is placed in three portions. More specifically, if the memory cell pair has the stored contents of "0", "0", the contact is not placed in any of three portions, that is, the common node N1 and respective source terminals as shown in FIG. 1A. On the contrary, if the memory cell pair has the stored contents of "1", "1", the contact 8 is placed in all the three portions as shown in FIG. 1B. In case of "0", "1" or "1", "0", the contact 8 is placed between the common node N1 and the bit line BL, is not placed on the source terminal side of the NTr having the stored contents of "0", and is placed on the source terminal side of the NTr having the stored contents of "1" as shown in FIGS. 1C and 1D.

In the ROM according to the first embodiment, the memory cell pair having the stored contents of "0", "0" does not have the contact 8 formed between the bit line BL and the common node N1. Consequently, a junction capacitance is decreased more than in the structure according to the prior art shown in FIG. 21. As a result, a capacity which is incidental to the bit line BL is decreased depending on the number of memory cells having the stored contents of "0", "0". Accordingly, speed can be increased and the consumed power can be reduced. The degree of a decrease depends on the ratio of the pair having the stored contents of "0", "0" to the whole.

Thus, the ROM according to the first embodiment has a structure in which 2-bit information can be written to the memory cell pair by setting connection/non-connection between the common node N1 and the bit line BL through the contact 8 and connection/non-connection between the respective source terminals of the NTrs 1 and 2 and a GND wiring VSS through the contact 8. Consequently, the common node N1 and the bit line BL can be set to the non-connection when writing "0", "0" to the memory cell pair.

As a result, the drain-contact is shared by the NTrs 1 and 2 which are provided adjacently to each other. Consequently, it is sufficient that the number of the drains of the transistors connected to the bit line is one for two NTrs. In addition, when writing "0", "0" to the memory cell pair, the common node N1 and the bit line BL are set to the non-connection so that the capacity which is incidental to the bit line can be decreased more. Consequently, a ROM in which the speed is increased and the consumed power is reduced can be obtained without a deterioration in a structure according to the prior art caused depending on the stored contents.

<Second Embodiment>

Figure 2A:
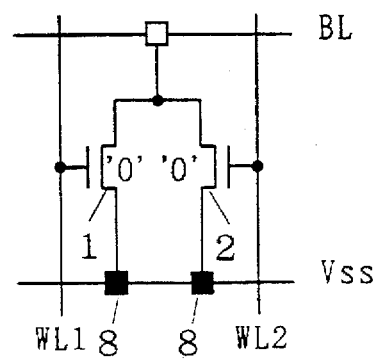
FIGS. 2A to 2C are circuit diagrams showing the structure of a memory cell pair of a ROM according to a second embodiment of the present invention.
Figure 2B:
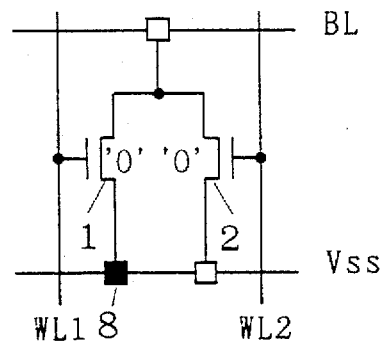
Figure 2C:
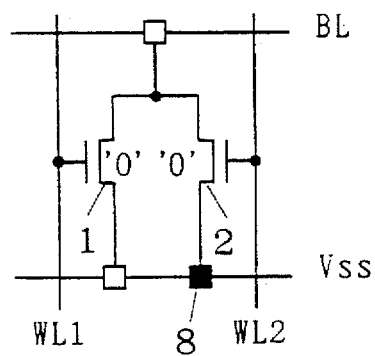

FIGS. 2A to 2C are circuit diagrams showing the structure of a memory cell pair of a ROM according to a second embodiment of the present invention. As shown in FIGS. 2A to 2C, in the case where the stored contents to be written to the memory cell pair are "0", "0", the memory cells do not malfunction even though a contact 8 is placed on at least one of the source terminals of NTrs 1 and 2. The reason is that a common node N1 is disconnected from a bit line BL. FIGS. 2A to 2C show examples of the combination of the presence of the contact 8 for connecting the NTrs and a GND wiring VSS. According to a structure shown in FIG. 2A, the sources of the NTrs 1 and 2 are connected to the GND wiring VSS. According to a structure shown in FIG. 2B, only the source of the NTr 1 is connected to the GND wiring VSS. According to a structure shown in FIG. 2C, only the source of the NTr 2 is connected to the GND wiring VSS.

In the ROM according to the second embodiment, a capacity which is incidental to the bit line BL is the same as in the structure of the ROM according to the first embodiment. In particular, the contact 8 is placed on at least one of the source terminals of the NTrs 1 and 2 so that the junction capacitance of the GND wiring VSS is increased and a malfunction hardly occurs even though a ground level potential VSS fluctuates.

<Third Embodiment>

Figure 3:
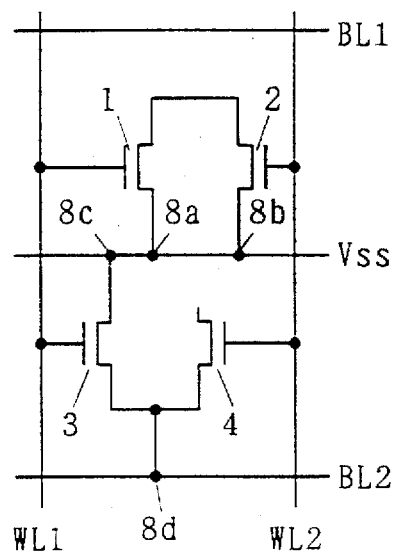
FIG. 3 is a circuit diagram showing the structure of a memory cell pair of a ROM according to a third embodiment of the present invention.

FIG. 3 is a circuit diagram showing the structure of a memory cell pair of a ROM according to a third embodiment of the present invention. As shown in FIG. 3, a GND wiring VSS is provided between two adjacent bit lines BL1 and BL2, and is shared by a first memory cell pair (NTr 1, NTr 2) connected to the bit line BL1 and a second memory cell pair (NTr 3, NTr 4) connected to the bit line BL2. 8a to 8d denote contacts. A method for storing data in the first and second memory cell pairs is the same as in the circuit according to the first embodiment shown in FIGS. 1A to 1D.

Figure 4:
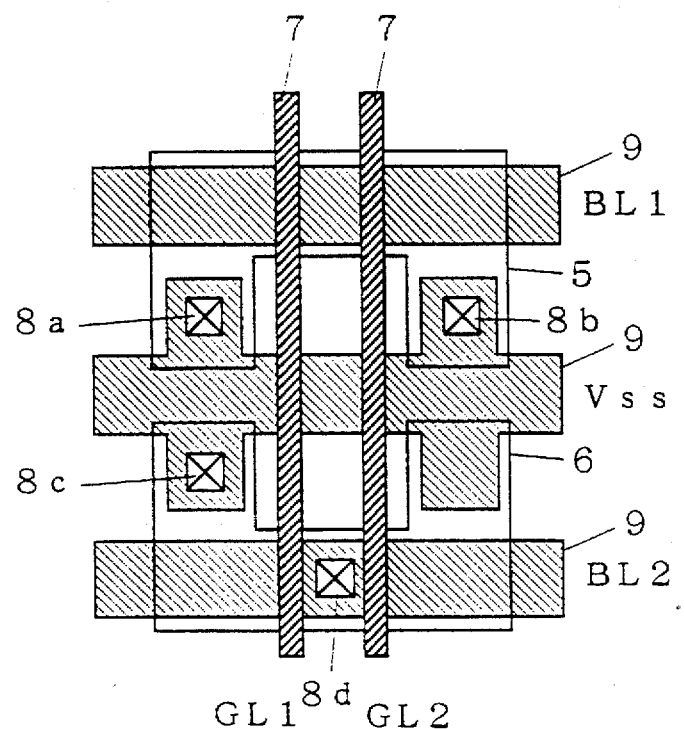
FIG. 4 is a plan view showing the structure of a layout corresponding to the circuit shown in FIG. 3.

FIG. 4 is a plan view showing the structure of a layout corresponding to that of the memory cell pair shown in FIG. 3. As shown in FIG. 4, a field region 5 for forming the NTrs 1 and 2 and a field region 6 for forming the NTrs 3 and 4 are provided. Two first layer wirings 7 which are provided longitudinally are used for gate wirings GL1 and GL2 respectively from the left of FIG. 4. Three second layer wirings 9 which are provided transversely are used for the bit line BL1, the GND wiring VSS and the bit line BL2 respectively from the top of FIG. 4. The gate wirings GL1 and GL2 are connected to word lines WL1 and WL2 which are not shown, or serve as the word lines WL1 and WL2, respectively.

The NTr 1 is formed by the field region 5 and the gate wiring GL1, the NTr 2 is formed by the field region 5 and the gate wiring GL2, the NTr 3 is formed by the field region 6 and the gate wiring GL1, and the NTr 4 is formed by the field region 6 and the gate wiring GL2. Furthermore, the source terminal of the NTr 1 is electrically connected to the GND wiring VSS by the contact 8a, the source terminal of the NTr 2 is electrically connected to the GND wiring VSS by the contact 8b, the source terminal of the NTr 3 is electrically connected to the GND wiring VSS by the contact 8c, and a common node N2 is electrically connected to the bit line BL2 by the contact 8d. The drain terminals of the NTrs 3 and 4 are connected in common through the common node N2.

Thus, the ROM according to the third embodiment has a structure in which the GND wiring VSS is shared by four transistors in two sets of memory cell pairs that are provided adjacently to each other in the direction of the formation of the word lines.

Accordingly, the number of transistors which are connected to the GND wiring VSS can be increased more than in the first embodiment. In addition, a capacity which is incidental to the GND wiring VSS can be increased more and a malfunction occurs more hardly even though a ground level VSS fluctuates. Furthermore, one GND wiring VSS is enough for four memory cells (transistors). Consequently, the effect that the layout area is reduced can also be obtained as shown in FIG. 4.

<Fourth Embodiment>

{Principle}

One or two pairs of memory cells have been described in the first embodiment. Actually, memory cell pairs are provided in a matrix having N rows and M columns (N≧2, M≧1) to form a group of memory cell pairs. A pair of word lines which correspond to the word lines WL1 and WL2 shown in FIGS. 1A to 1D are provided for each row. A bit line which corresponds to the bit line BL shown in FIGS. 1A to 1D is provided for each column. A GND wiring which corresponds to the GND wiring VSS shown in FIGS. 1A to 1D is provided for each column.

Figure 5:
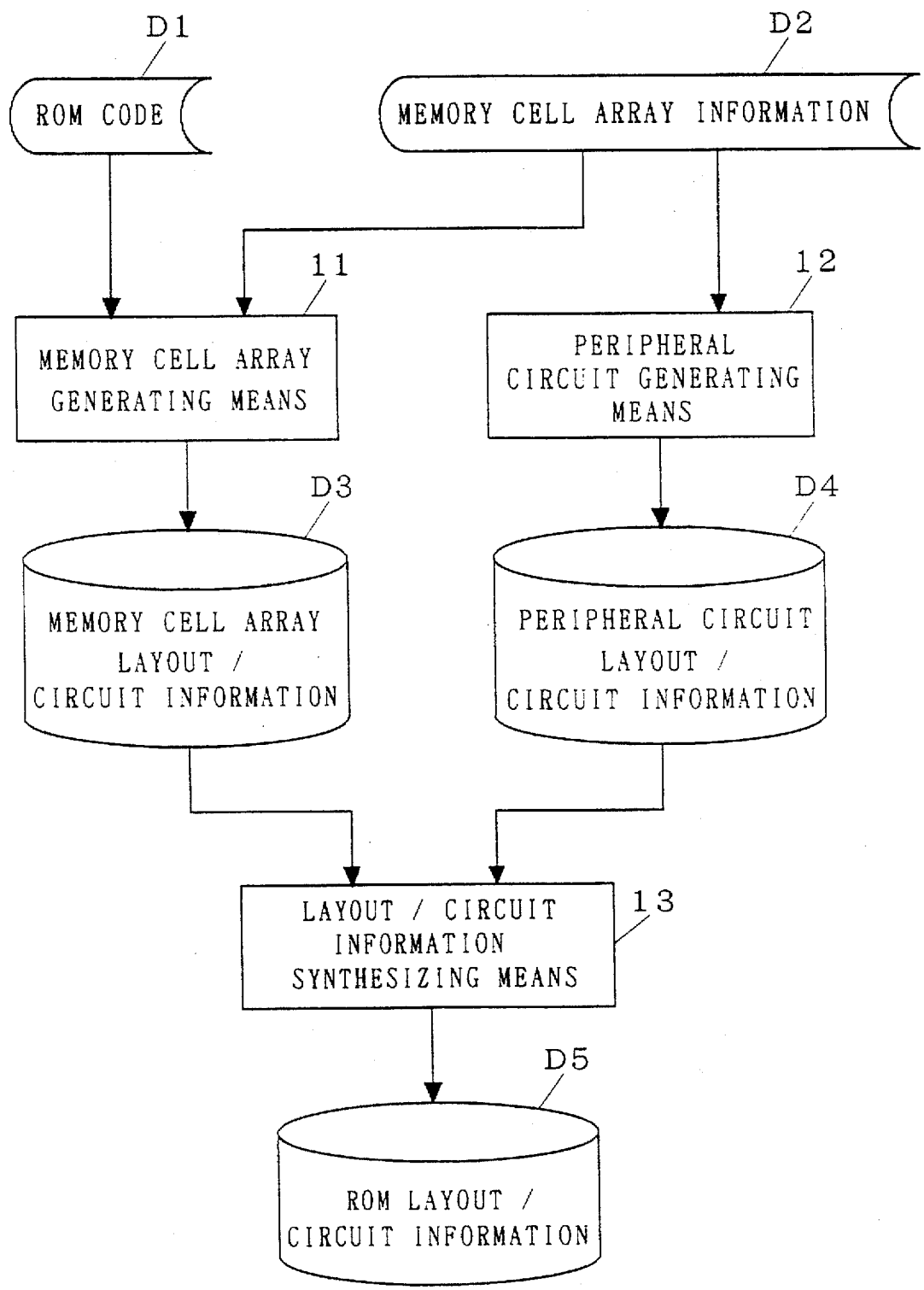
FIG. 5 is a block diagram showing the structure of a general layout/circuit information generating apparatus.

FIG. 5 is a block diagram showing the structure of a general layout/circuit information generating apparatus of a ROM. As shown in FIG. 5, memory cell array generating means 11 receives a ROM code D1 from ROM code giving means which is not shown, and receives memory cell array information D2 from memory cell array information giving means which is not shown. The ROM code D1 is write information which is stored in each memory cell of a memory cell array. The memory cell array information D2 is necessary for forming a ROM for the number of bit lines (the number of bits), the number of word line pairs (the number of words), CPB (Column Per Bit) information and the like. The CPB indicates the number of columns on a layout per bit, by which the aspect ratio, that is, the shape of the ROM having the same bit word structure can be changed.

The memory cell array generating means 11 generates memory cell array layout/circuit information D3 on the basis of the ROM code D1 and the memory cell array information D2.

Peripheral circuit generating means 12 receives the memory cell array information D2 from the memory cell array information giving means which is not shown, and generates peripheral circuit layout/circuit information D4 based on the memory cell array information D2. Examples of a peripheral circuit are a decoder, a sense amplifier, an output buffer and the like.

Layout/circuit information synthesizing means 13 synthesizes the memory cell array layout/circuit information D3 and the peripheral circuit layout/circuit information D4 to generate ROM layout/circuit information D5 which defines the layout/circuit of the whole ROM on the basis of the information D3 and D4.

Thus, the general layout/circuit information generating apparatus generates the peripheral circuit layout/circuit information D4 from only the memory cell array information D2 irrespective of the ROM code D1.

Figure 6A:
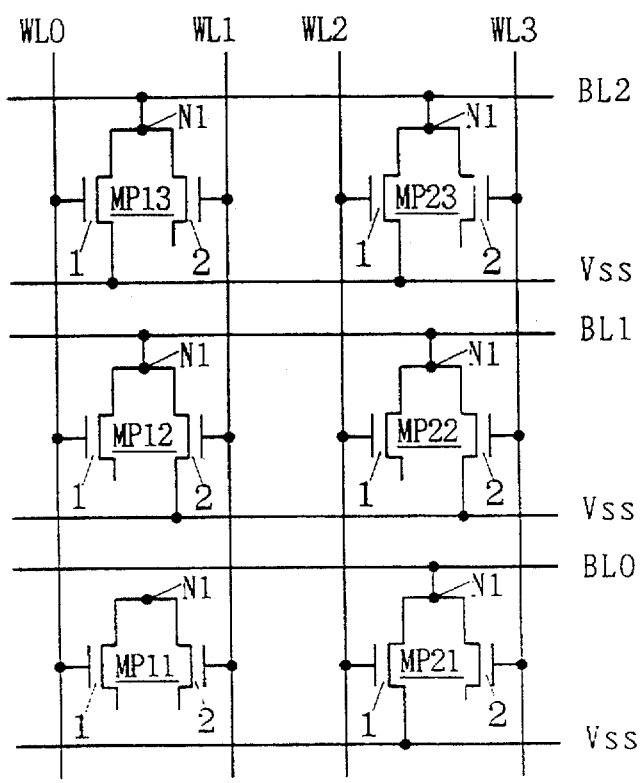
FIGS. 6A and 6B are circuit diagrams for explaining the principle according to a fourth embodiment of the present invention.
Figure 6B:
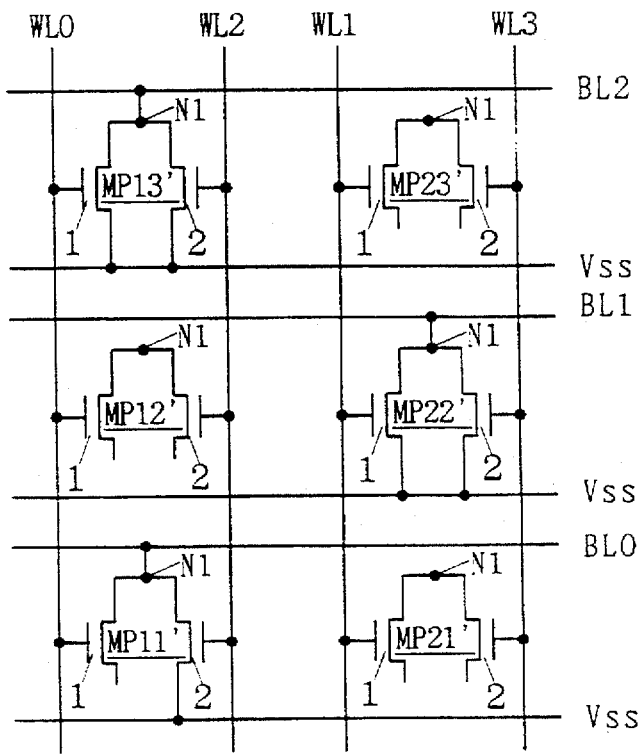

FIGS. 6A and 6B are circuit diagrams showing the principle according to a fourth embodiment. In the case where a ROM which comprises memory cell pairs having the structure according to the first embodiment is formed, there are memory cell pairs MPs in 2 rows and 3 columns (MP11, MP12, MP13, MP21, MP22, MP23) as shown in FIGS. 6A and 6B. A pair of word lines WL0 and WL1 are provided for the memory cell pairs MP11, MP12 and MP13 in a first row. A pair of word lines WL2 and WL3 are provided for the memory cell pairs MP21, MP22 and MP23 in a second row. A bit line BL0 and a GND wiring VSS0 are provided for the memory cell pairs MP11 and MP21 in a first column. A bit line BL1 and a GND wiring VSS1 are provided for the memory cell pairs MP12 and MP22 in a second column. A bit line BL2 and a GND wiring VSS2 are provided for the memory cell pairs MP13 and MP23 in a third column.

In case of this structure, the capacity of the bit line depends on the data to be stored. Consequently, it takes the longest time to charge and discharge a signal that flows in a bit line to which the maximum number of common nodes N1 of the drains of NTrs 1 and 2 forming the memory cell pair MP are connected. Consequently, an access time is determined by the signal charge and discharge time of the bit line. For this reason, there is a possibility that speed cannot be increased optimally depending on the stored contents. The fourth embodiment tries to solve such a problem.

For example, in the case where (0, 0), (0, 1), (1, 0), (1, 0), (0, 1) and (1, 0) are written to the memory cell pairs MP11 to MP13 and MP21 to MP23 of the ROM respectively, the ROM is formed as shown in FIG. 6A on the basis of the ROM layout/circuit information D5 generated by the layout/circuit information generating apparatus shown in FIG. 5.

In this case, two common nodes N1 are connected to the bit lines BL1 and BL2. For this reason, the access time is determined by the signal charge and discharge time of the bit lines BL1 and BL2. As shown in FIG. 6B, the word lines WL1 and WL2 are replaced with each other, and the memory cell pairs MP11 to MP13 and MP21 to MP23 are changed into memory cell pairs MP11' to MP13' and MP21' to MP23', respectively.

According to the structure shown in FIG. 6B, consequently, (0, 1), (0, 0), (1, 1), (0, 0), (1, 1) and (0, 0) are written to the memory cell pairs MP11' to MP13' and MP21' to MP23' of the ROM, and the memory cell pairs MP12' and MP23' to which (0, 0) is written are newly provided and the numbers of the common nodes N1 connected to the bit lines BL1 and BL2 are decreased by 1 respectively so that one common node N1 is connected to each of the bit lines BL0 to BL2. Thus, the signal charge and discharge time of the bit lines BL1 and BL2 is reduced so that the access time can be shortened more than in the structure of FIG. 6A.

A row decoder which acts as a selecting circuit for selecting the word line WL based on a row address signal needs to perform decode output (selection of the word line WL) in consideration of the physical arrangement exchange of the word lines WL1 and WL2.

{Structure}

Figure 7:
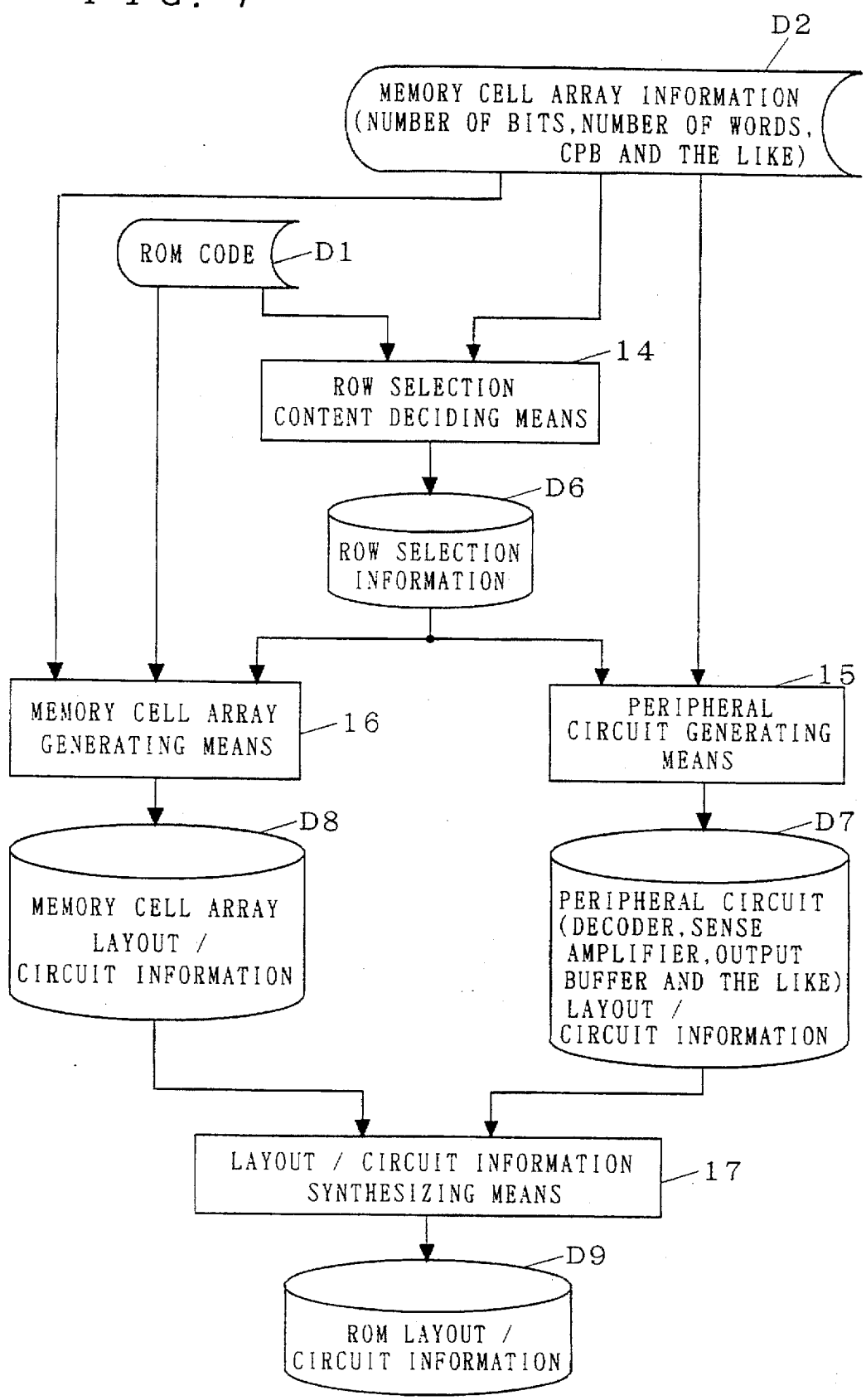
FIG. 7 is a block diagram showing the structure of a layout/circuit information generating apparatus for a ROM according to the fourth embodiment of the present invention.

FIG. 7 is a block diagram showing the structure of a layout/circuit information generating apparatus according to a fourth embodiment of the present invention. As shown in FIG. 7, row selection content deciding means 14 receives a ROM code D1 from ROM code giving means which is not shown, and receives memory cell array information D2 from memory cell array information giving means which is not shown. Based on the ROM code D1 and the memory cell array information D2, the row selection content deciding means 14 decides the decode output order (word line selection contents) to output row selection information D6 such that the memory cell pair MP to which (0, 0) is written appears uniformly in each column.

For example, in the case where four word lines are formed in the structure of the memory cell according to the first embodiment, the decode output order is usually decided so as to select word lines WL0, WL1, WL2 and WL3 in this order from the left as shown in FIG. 6A. The decode output order is decided so as to select the word lines WL0, WL2, WL1 and WL3 in this order from the left as shown in FIG. 6B such that the memory cell pair MP to which (0, 0) is written appears uniformly in each column.

Figure 13A:
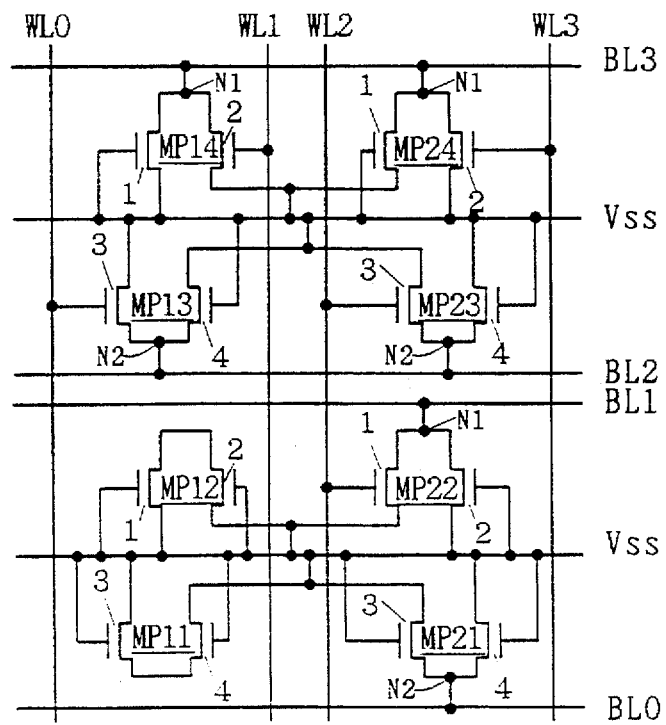
FIGS. 13A and 13B are circuit diagrams for explaining the principle according to the eighth embodiment of the present invention.
Figure 13B:
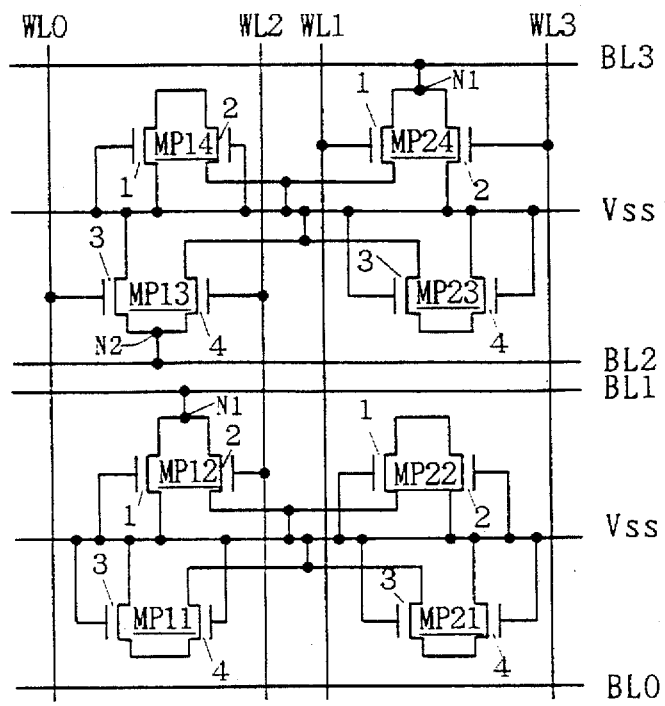

For example, in the case where four word lines are formed in the structure of the memory cell according to the first embodiment, the decode output order is usually decided so as to select word lines WL0, WL1, WL2 and WL3 in this order from the left as shown in FIG. 13A. The decode output order is decided so as to select the word lines WL0, WL2, WL1 and WL3 in this order from the left as shown in FIG. 13B such that a memory cell pair MP to which (0, 0) is written appears uniformly in each column that is defined by bit lines BL0 to BL3.

Peripheral circuit generating means 15 receives the memory cell array information D2 and the row selection information D6 to generate peripheral circuit layout/circuit information D7 on the basis of the information D2 and D6. In this case, the decode output order of the row decoder is decided based on the row selection information D6.

Memory cell array generating means 16 generates memory cell array layout/circuit information D8 on the basis of the ROM code D1, the memory cell array information D2 and the row selection information D6. In this case, data on the formation of the contact 8 for the NTrs 1 and 2 of the memory cell pair MP are written by matching the ROM code D1 and the row selection information D6 based thereon.

For example, in the case where the ROM code D1 designates to write (1, 0, 1, 0) to the memory cell pairs MP13 and MP23 in a third column which are connected to the bit line BL2 and the row selection information D6 indicates the selection of the word lines WL0, WL2, WL1 and WL3 in this order as shown in FIG. 6A, the memory cell array layout/circuit information D8 is generated as shown in FIG. 6B. The memory cell array layout/circuit information D8 indicates a layout structure in which the write data for a second row (WL1) and a third row (WL2) are replaced with each other and (1, 1, 0, 0) is written to the memory cell pairs MP13' and MP23' in a third column, respectively.

For example, in the case where the ROM code D1 indicates to write (0, 1, 0, 1) to the memory cell pairs MP14 and MP24 in a fourth column which are connected to a bit line BL3, the ROM code D1 indicates to write (1, 0, 1, 0) to the memory cell pairs MP13 and MP23 in the third column which are connected to the bit line BL2 and the row selection information D6 indicates the selection of the word lines WL0, WL2, WL1 and WL3 in this order as shown in FIG. 13A, memory cell array layout/circuit information D8' is generated as shown in FIG. 13B. The memory cell array layout/circuit information D8' indicates a layout structure in which the write data for the second row (WL1) and the third row (WL2) are replaced with each other, (0, 0, 1, 1) is written to the memory cell pairs MP14' and MP24' in a fourth column respectively and (1, 1, 0, 0) is written to the memory cell pairs MP13' and MP23' in the third column respectively.

Layout/circuit information synthesizing means 17 synthesizes the peripheral circuit layout/circuit information D7 and memory cell array layout/circuit information D8 to generate ROM layout/circuit information D9 which defines the layout/circuit of the whole ROM on the basis of the information D7 and D8.

Thus, the row selection content deciding means 14 of the layout/circuit information generating apparatus according to the fourth embodiment decides the decode output order of each word line to output the row selection information D6 on the basis of the ROM code D1 and the memory cell array information D2 such that the memory cell pair MP to which (0, 0) is written appears uniformly in each column, that is, a capacity which is incidental to each bit line is decreased. The peripheral circuit generating means 15 and the memory cell array generating means 16 generate the peripheral circuit layout/circuit information D7 and the memory cell array layout/circuit information D8 on the basis of the row selection information D6, respectively.

In the ROM which is defined by the ROM layout/circuit information D9 that is generated by synthesizing the circuit information D7 and D8 by the layout/circuit information synthesizing means 17, consequently, the capacity which is incidental to each bit line can be reduced optimally on the basis of the ROM code D1. Thus, a circuit structure in which speed is increased and the consumed power is reduced can be obtained.

<Fifth Embodiment>

FIGS. 8A to 8D are circuit diagrams showing the structure of a memory cell pair of a ROM according to a fifth embodiment of the present invention. As shown in FIGS. 8A to 8D, NTrs 1 and 2 are paired. The NTrs 1 and 2 are provided adjacently to each other in the direction of the formation of a bit line BL between two adjacent word lines WL1 and WL2. The drains of the NTrs 1 and 2 are connected in common through a common node N1 to form a memory cell.

In the memory cell pair shown in FIGS. 8A to 8D, the source terminals of the NTrs 1 and 2 are connected to a GND wiring VSS in common, and a region in which a contact is placed is provided between the common node N1 and the bit line BL. Data are stored with a combination of the presence of the contact between the common node N1 and the bit line BL and the connection of gate terminals to the corresponding word lines WL or the GND wiring VSS.

Figure 8A:
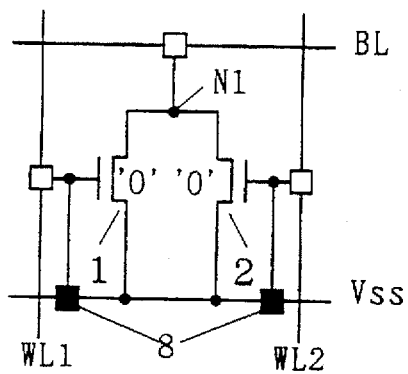
FIGS. 8A to 8D are circuit diagrams showing the structure of a memory cell pair of a ROM according to a fifth embodiment of the present invention.
Figure 8B:
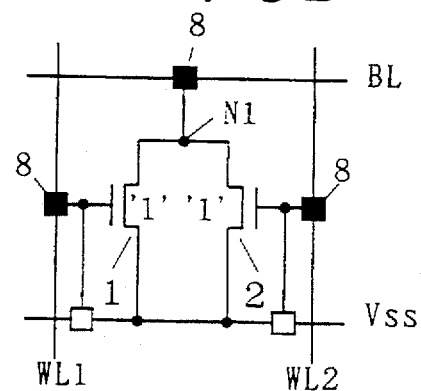

In the case where the memory cell pair has the stored contents of "0", "0", the contact 8 is not placed between the common node N1 and the bit line BL but is placed between the respective gate terminals of the NTrs 1 and 2 and the GND wiring VSS to connect the respective gate terminals of the NTrs 1 and 2 to the GND wiring VSS as shown in FIG. 8A. On the contrary, in the case where the memory cell pair has the stored contents of "1", "1", the contact 8 is placed between the common node N1 and the bit line BL, is placed between the gate terminal of the NTr 1 and the word line WL1 to connect the gate terminal of the NTr 1 to the word line WL1, and is placed between the gate terminal of the NTr 2 and the word line WL2 to connect the gate terminal of the NTr 2 to the word line WL2 as shown in FIG. 8B.

Figure 8C:
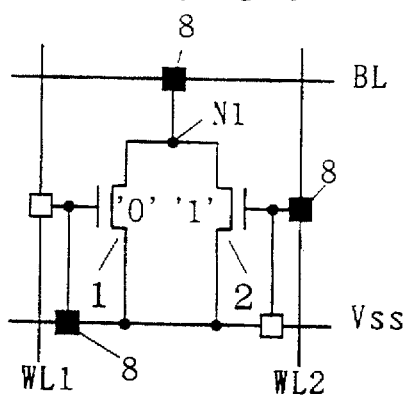
Figure 8D:
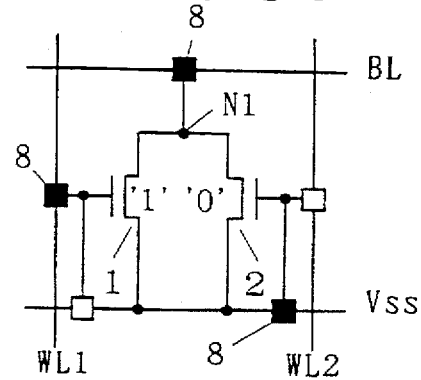

In case of "0", "1" or "1", "0", the contact 8 is placed between the common node N1 and the bit line BL, is placed between the gate terminal of the NTr having the stored contents of "0" and the GND wiring VSS to connect the same gate terminal to the GND wiring VSS, and is placed between the gate terminal of the NTr having the stored contents of "1" and the word line WL to connect the same gate terminal to the corresponding word line WL as shown in FIGS. 8C and 8D.

In the ROM according to the fifth embodiment, the memory cell pair having the stored contents of "0", "0" has no contact 8 formed between the bit line BL and the common node N1. Consequently, the junction capacitance of the bit line BL is reduced. As a result, a capacity which is incidental to the bit line BL is decreased depending on the number of memory cells having the stored contents of "0", "0". Accordingly, speed can be increased and the consumed power can be reduced. The degree of a decrease depends on the ratio of the pair having the stored contents of "0", "0" to the whole.

Thus, the ROM according to the fifth embodiment has a structure in which 2-bit information can be written to the memory cell pair by the connection/non-connection between the common node N1 and the bit line BL by the contact 8, and the selection of an object to be connected to the respective gate terminals of the NTrs 1 and 2 (the corresponding word line WL or the GND wiring VSS). Consequently, the common node N1 and the bit line BL can be set to the non-connection when writing "0", "0" to the memory cell pair.

As a result, the drain-contact is shared by the NTrs 1 and 2 which are provided adjacently to each other. Consequently, it is sufficient that the number of the drains of the transistors connected to the bit line is one for two NTrs. In addition, when writing "0", "0" to the memory cell pair, the common node N1 and the bit line BL are set to the non-connection so that the capacity which is incidental to the bit line can be decreased more. In the same manner as the ROM according to the first embodiment, consequently, the ROM according to the fifth embodiment can be obtained in which the speed is increased and the consumed power is reduced without a deterioration caused depending on the stored contents.

<Sixth Embodiment>

Figure 9A:
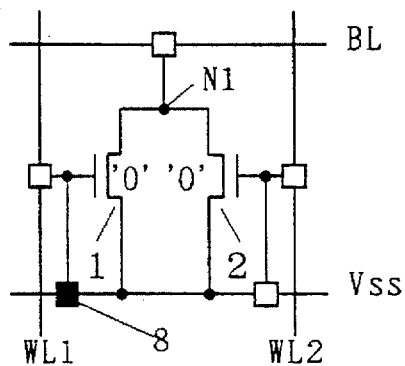
FIGS. 9A to 9C are circuit diagrams showing the structure of a memory cell pair of a ROM according to a sixth embodiment of the present invention.
Figure 9B:
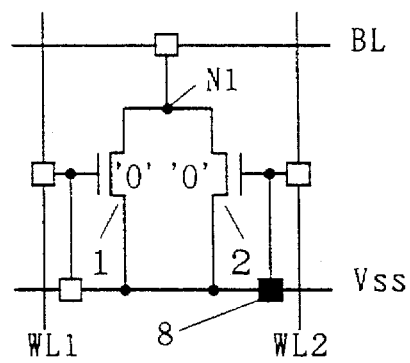
Figure 9C:
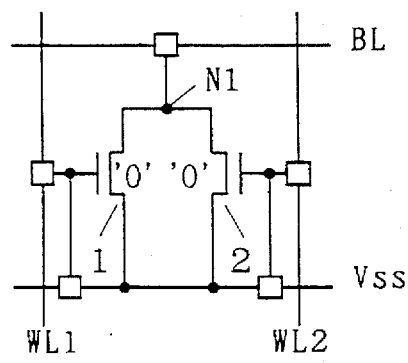

FIGS. 9A to 9C are circuit diagrams showing the structure of a memory cell pair of a ROM according to a sixth embodiment of the present invention. As shown in FIGS. 9A to 9C, in the case where the stored contents to be written to the memory cell pair are "0", "0", the memory cells do not malfunction even though at least one of the gate terminals of NTrs 1 and 2 is brought into the floating state. The reason is that a common node N1 is disconnected from a bit line BL.

FIGS. 9A to 9C show examples of the combination that the gate terminals of the NTrs are / are not brought into the floating state. According to a structure shown in FIG. 9A, only the gate terminal of the NTr 1 is connected to a GND wiring VSS. According to a structure shown in FIG. 9B, only the gate terminal of the NTr 2 is connected to the GND wiring VSS. According to a structure shown in FIG. 9C, the gate terminals of the NTrs 1 and 2 are brought into the floating state.

In the ROM according to the sixth embodiment, a capacity which is incidental to the bit line BL is the same as in the structure of the ROM according to the fifth embodiment. In particular, at least one of the gate terminals of the NTrs 1 and 2 is brought into the floating state so that a contact for connection to the GND wiring VSS does not need to be formed in a portion which should be brought into the floating state. Consequently, the amount of data for layout information of the ROM can be reduced.

<Seventh Embodiment>

Figure 10:
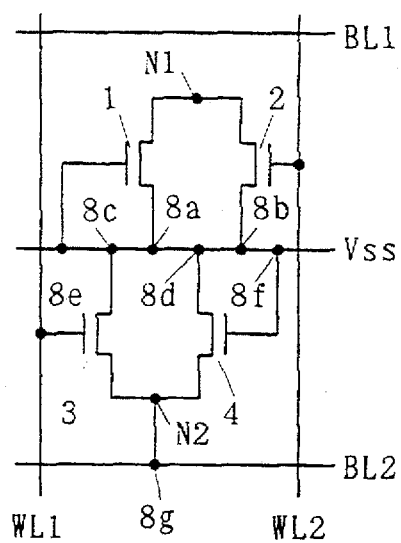
FIG. 10 is a circuit diagram showing the structure of a memory cell pair of a ROM according to a seventh embodiment of the present invention.

FIG. 10 is a circuit diagram showing the structure of a memory cell pair of a ROM according to a seventh embodiment of the present invention. As shown in FIG. 10, a GND wiring VSS is provided between two adjacent bit lines BL1 and BL2, and is shared by a first memory cell pair (NTr 1, NTr 2) connected to the bit line BL1 and a second memory cell pair (NTr 3, NTr 4) connected to the bit line BL2. N1 and N2 denote common nodes, and 8a to 8g denote contacts.

Thus, the ROM according to the seventh embodiment has a structure in which the GND wiring VSS is shared by four transistors in two sets of memory cell pairs that are provided adjacently to each other in the direction of the formation of word lines.

Accordingly, the number of transistors which are connected to the GND wiring VSS can be increased more than in the fifth embodiment. In addition, a capacity which is incidental to the GND wiring VSS can be increased more and a malfunction occurs more hardly even though the ground level VSS fluctuates. Furthermore, one GND wiring VSS is enough for four memory cells (transistors). Consequently, the effect that the layout area is reduced can also be obtained.

<Eighth Embodiment>

Figure 11:
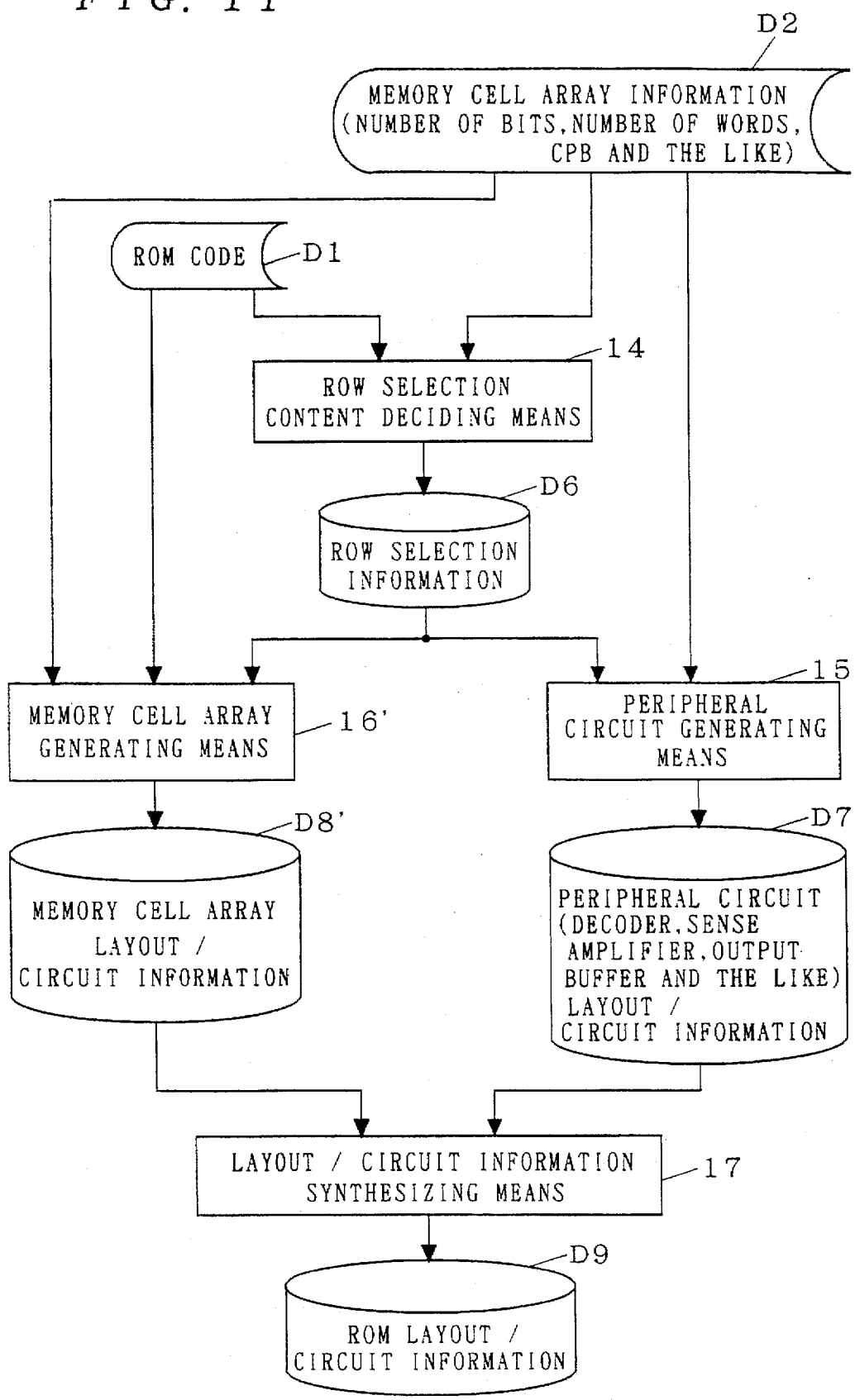
FIG. 11 is a block diagram showing the structure of a layout/circuit information generating apparatus for a ROM according to an eighth embodiment of the present invention.

FIG. 11 is a block diagram showing the structure of a layout/circuit information generating apparatus according to an eighth embodiment of the present invention. As shown in FIG. 11, row selection content deciding means 14 receives a ROM code D1 from ROM code giving means which is not shown, and receives memory cell array information D2 from memory cell array information giving means which is not shown. Based on the ROM code D1 and the memory cell array information D2, the row selection content deciding means 14 decides the decode output order (word line selection contents) to output row selection information D6 such that a memory cell pair MP to which (0, 0) is written appears uniformly in each column.

Figure 12A:
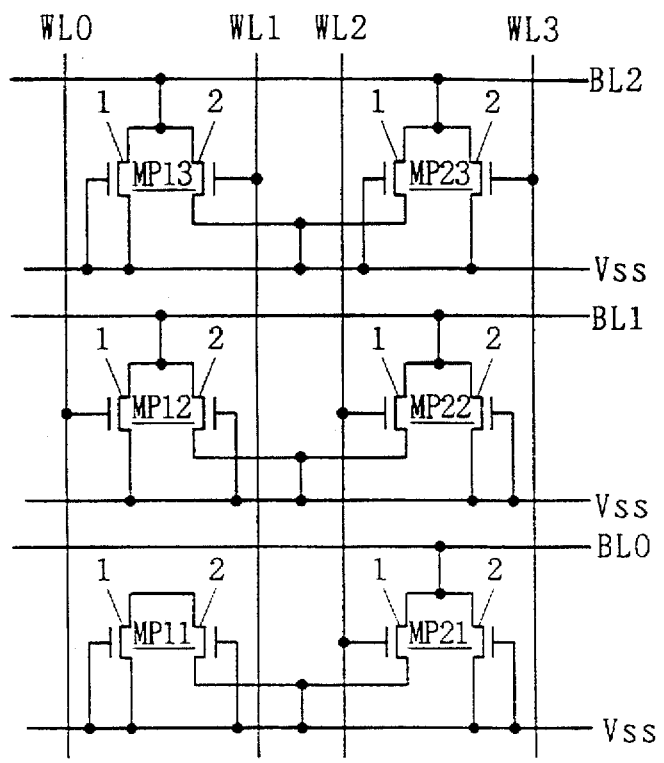
FIGS. 12A and 12B are circuit diagrams for explaining the principle according to the eighth embodiment of the present invention.
Figure 12B:
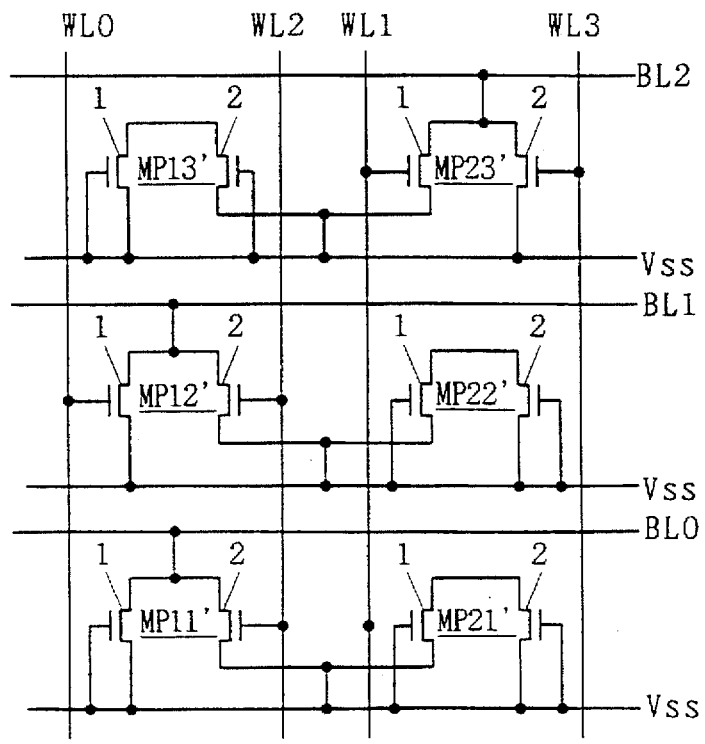

For example, in the case where four word lines are formed in the structure of the memory cell according to the fifth embodiment, the decode output order is usually decided so as to select word lines WL0, WL1, WL2 and WL3 in this order from the left as shown in FIG. 12A. The decode output order is decided so as to select the word lines WL0, WL2, WL1 and WL3 in this order from the left as shown in FIG. 12B such that the memory cell pair MP to which (0, 0) is written appears uniformly in each column.

For example, in the case where four word lines are formed in the structure of the memory cell according to the seventh embodiment, the decode output order is usually decided so as to select word lines WL0, WL1, WL2 and WL3 in this order from the left as shown in FIG. 13A. The decode output order is decided so as to select the word lines WL0, WL2, WL1 and WL3 in this order from the left as shown in FIG. 13B such that the memory cell pair MP to which (0, 0) is written appears uniformly in each column that is defined by bit lines BL0 to BL3.

Peripheral circuit generating means 15 receives the memory cell array information D2 and the row selection information D6 to generate peripheral circuit layout/circuit information D7 on the basis of the information D2 and D6. In this case, the decode output order of a row decoder is decided based on the row selection information D6.

Memory cell array generating means 16' generates memory cell array layout/circuit information D8' on the basis of the ROM code D1, the memory cell array information D2 and the row selection information D6. In this case, data are written to NTrs 1 and 2 of the memory cell pair MP by matching the ROM code D1 and the row selection information D6 based thereon.

For example, in the case where the ROM code D1 designates to write (0,1, 0, 1) to the memory cell pairs MP13 and MP23 in a third column which are connected to the bit line BL2 respectively and the row selection information D6 indicates the selection of the word lines WL0, WL2, WL1 and WL3 in this order as shown in FIG. 12A, the memory cell array layout/circuit information D8' is generated as shown in FIG. 12B. The memory cell array layout/circuit information D8' indicates a layout structure in which the write data for a second row (WL1) and a third row (WL2) are replaced with each other and (0, 0, 1, 1) is written to the memory cell pairs MP13' and MP23' in a third column, respectively.

For example, in the case where the ROM code D1 designates to write (0, 1, 0, 1) to the memory cell pairs MP14 and MP24 in a fourth column which are connected to the bit line BL3 respectively, the ROM code D1 indicates to write (1, 0, 1, 0) to the memory cell pairs MP13 and MP23 in the third column which are connected to the bit line BL2 respectively, and the row selection information D6 indicates the selection of the word lines WL0, WL2, WL1 and WL3 in this order as shown in FIG. 13A, memory cell array layout/circuit information D8' is generated as shown in FIG. 13B. The memory cell array layout/circuit information D8' designates a layout structure in which the write data for the second row (WL1) and the third row (WL2) are replaced with each other, (0, 0, 1, 1) is written to memory cell pairs MP14' and MP24' in the fourth column respectively and (1, 1, 0, 0) is written to the memory cell pairs MP13' and MP23' in the third column respectively.

Layout/circuit information synthesizing means 17 synthesizes the peripheral circuit layout/circuit information D7 and the memory cell array layout/circuit information D8' to generate ROM layout/circuit information D9 which defines the layout/circuit of the whole ROM on the basis of the information D7 and D8'.

Thus, the row selection content deciding means 14 of the layout/circuit information generating apparatus according to the eighth embodiment decides the decode output order of each word line to output the row selection information D6 on the basis of the ROM code D1 and the memory cell array information D2 such that a capacity which is incidental to each bit line is decreased. The peripheral circuit generating means 15 and the memory cell array generating means 16' generates the peripheral circuit layout/circuit information D7 and the memory cell array layout/circuit information D8' on the basis of the row selection information D6, respectively.

In the ROM which is defined by the ROM layout/circuit information D9 generated by synthesizing the circuit information D7 and D8' by the layout/circuit information synthesizing means 17, consequently, the capacity which is incidental to each bit line can be reduced optimally on the basis of the ROM code D1 so that a circuit structure in which speed is increased and the consumed power is reduced can be obtained.

<Ninth Embodiment>

Figure 14:
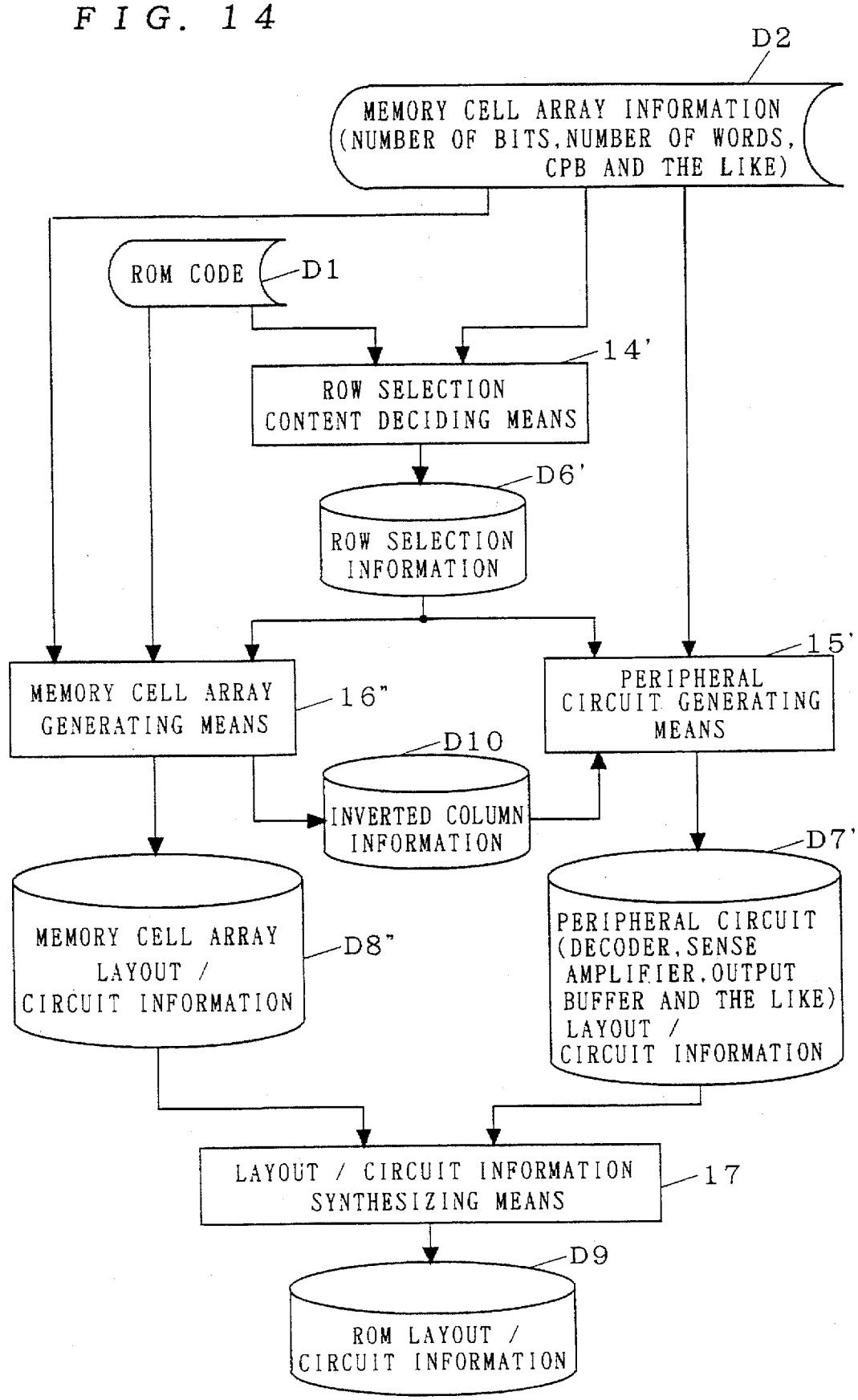
FIG. 14 is a block diagram showing the structure of a layout/circuit information generating apparatus for a ROM according to a ninth embodiment of the present invention.

FIG. 14 is a block diagram showing the structure of a layout/circuit information generating apparatus according to a ninth embodiment of the present invention. In FIG. 14, the structure and operation other than those of row selection content deciding means 14', peripheral circuit generating means 15' and memory cell array generating means 16" are the same as those of the layout/circuit information generating apparatus according to the eighth embodiment shown in FIG. 11. The row selection content deciding means 14', the peripheral circuit generating means 15' and the memory cell array generating means 16" will be described below in detail. FIGS. 15 to 19 are diagrams for explaining the operation of the layout/circuit information generating apparatus according to the ninth embodiment of the present invention.

Figure 15:
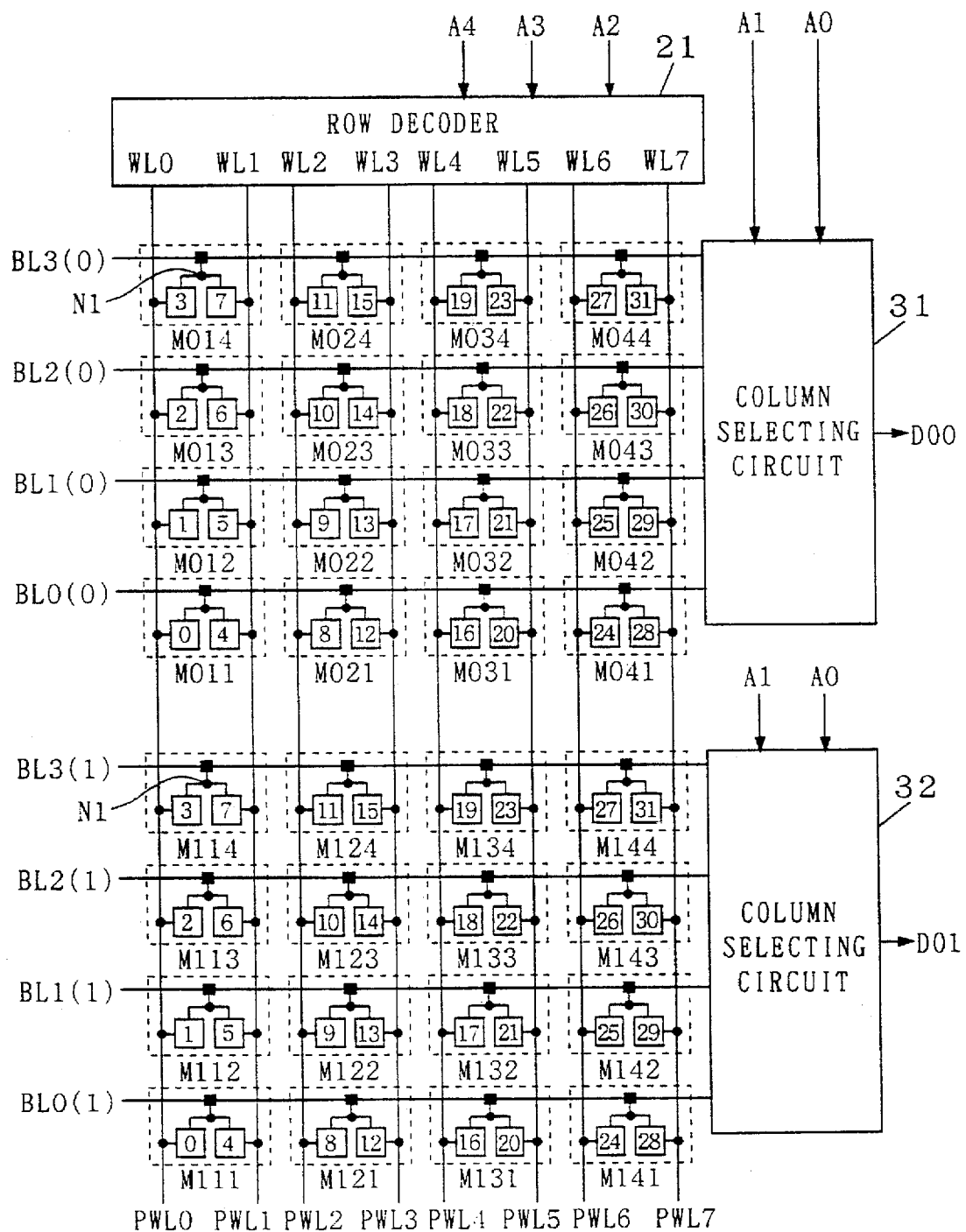
FIG. 15 is a diagram for explaining the operation according to the ninth embodiment of the present invention.

FIG. 15 is a circuit diagram showing the structure of a memory cell array of a general ROM. As shown in FIG. 15, a row decoder 21 receives row address signals A2 to A4 to bring one of word lines WL0 to WL7 into the active state based on the row address signals A2 to A4. PWL0 to PWL7 denote the physical arrangement order of the word lines (which is the same as in FIGS. 16 to 19).

A column selecting circuit 31 is connected to bit lines BL0(0) to BL3(0) to receive column address signals A0 and A1, to select one of the bit lines BL0(0) to BL3(0) and to output, as a data output D00, a signal obtained from the selected bit line BL(0).

A column selecting circuit 32 is connected to bit lines BL0(1) to BL3(1) to receive column address signals A0 and A1, to select one of the bit lines BL0(1) to BL3(1) and to output, as a data output D01, a signal obtained from the selected bit line BL(1).

4×4 memory cell pairs M011 to M014, M021 to M024, M031 to M034, and M041 to M044 are selected by the row decoder 21 and the column selecting circuit 31 to send a data output D00.

4×4 memory cell pairs M111 to M114, M121 to M124, M131 to M134, and M141 to M144 are selected by the row decoder 21 and the column selecting circuit 32 to send a data output D01.

The memory cell pairs M011 to M014, M021 to M024, M031 to M034, and M041 to M044 are connected to word lines (WL0, WL1), (WL2, WL3), (WL4, WL5) and (WL6, WL7), respectively. The memory cell pairs M111 to M114, M121 to M124, M131 to M134, and M141 to M144 are connected to the word lines (WL0, WL1), (WL2, WL3), (WL4, WL5) and (WL6, WL7), respectively.

Memory cell pairs (M011, M021, M031, M041), (M012, M022, M032, M042), (M013, M023, M033, M043) and (M014, M024, M034, M044) are connected to the bit lines BL0(0) to BL3(0), respectively.

Memory cell pairs (M111, M121, M131, M141), (M112, M122, M132, M142), (M113, M123, M133, M143) and (M114, M124, M134, M144) are connected to the bit lines BL0(1) to BL3(1), respectively.

As shown in FIG. 15, memory cell pairs M0ij and M1ij (i=1 to 4, j=1 to 4) are set to the same address. Numbers 0 to 31 are assigned to the respective addresses of the memory cell pairs.

Table 1 shows address signals A0 to A4 corresponding to the addresses, and stored data (D01 represents the stored data of the memory cell pair M1ij and D00 represents the stored data of the memory cell pair M0ij).

TABLE 1

| DECIMAL | ADDRESS | | | | | DATA | |
|---|---|---|---|---|---|---|---|
| | A4 | A3 | A2 | A1 | A0 | D01 | D00 |
| 0 | 0 | 0 | 0 | 0 | 0 | 1 | 0 |
| 1 | 0 | 0 | 0 | 0 | 1 | 1 | 1 |
| 2 | 0 | 0 | 0 | 1 | 0 | 0 | 0 |
| 3 | 0 | 0 | 0 | 1 | 1 | 0 | 1 |
| 4 | 0 | 0 | 1 | 0 | 0 | 0 | 1 |
| 5 | 0 | 0 | 1 | 0 | 1 | 1 | 0 |
| 6 | 0 | 0 | 1 | 1 | 0 | 1 | 0 |
| 7 | 0 | 0 | 1 | 1 | 1 | 0 | 0 |

TABLE 1-continued

| DECIMAL | ADDRESS | | | | | DATA | |
|---|---|---|---|---|---|---|---|
| | A4 | A3 | A2 | A1 | A0 | D01 | D00 |
| 8 | 0 | 1 | 0 | 0 | 0 | 1 | 1 |
| 9 | 0 | 1 | 0 | 0 | 1 | 0 | 0 |
| 10 | 0 | 1 | 0 | 1 | 0 | 1 | 1 |
| 11 | 0 | 1 | 0 | 1 | 1 | 1 | 1 |
| 12 | 0 | 1 | 1 | 0 | 0 | 0 | 1 |
| 13 | 0 | 1 | 1 | 0 | 1 | 1 | 1 |
| 14 | 0 | 1 | 1 | 1 | 0 | 1 | 1 |
| 15 | 0 | 1 | 1 | 1 | 1 | 0 | 0 |
| 16 | 1 | 0 | 0 | 0 | 0 | 0 | 1 |
| 17 | 1 | 0 | 0 | 0 | 1 | 0 | 1 |
| 18 | 1 | 0 | 0 | 1 | 0 | 1 | 0 |
| 19 | 1 | 0 | 0 | 1 | 1 | 1 | 1 |
| 20 | 1 | 0 | 1 | 0 | 0 | 0 | 0 |
| 21 | 1 | 0 | 1 | 0 | 1 | 0 | 0 |
| 22 | 1 | 0 | 1 | 1 | 0 | 1 | 1 |
| 23 | 1 | 0 | 1 | 1 | 1 | 1 | 1 |
| 24 | 1 | 1 | 0 | 0 | 0 | 1 | 0 |
| 25 | 1 | 1 | 0 | 0 | 1 | 1 | 1 |
| 26 | 1 | 1 | 0 | 1 | 0 | 0 | 0 |
| 27 | 1 | 1 | 0 | 1 | 1 | 0 | 1 |
| 28 | 1 | 1 | 1 | 0 | 0 | 0 | 1 |
| 29 | 1 | 1 | 1 | 0 | 1 | 1 | 0 |
| 30 | 1 | 1 | 1 | 1 | 0 | 1 | 1 |
| 31 | 1 | 1 | 1 | 1 | 1 | 1 | 1 |

Figure 16:
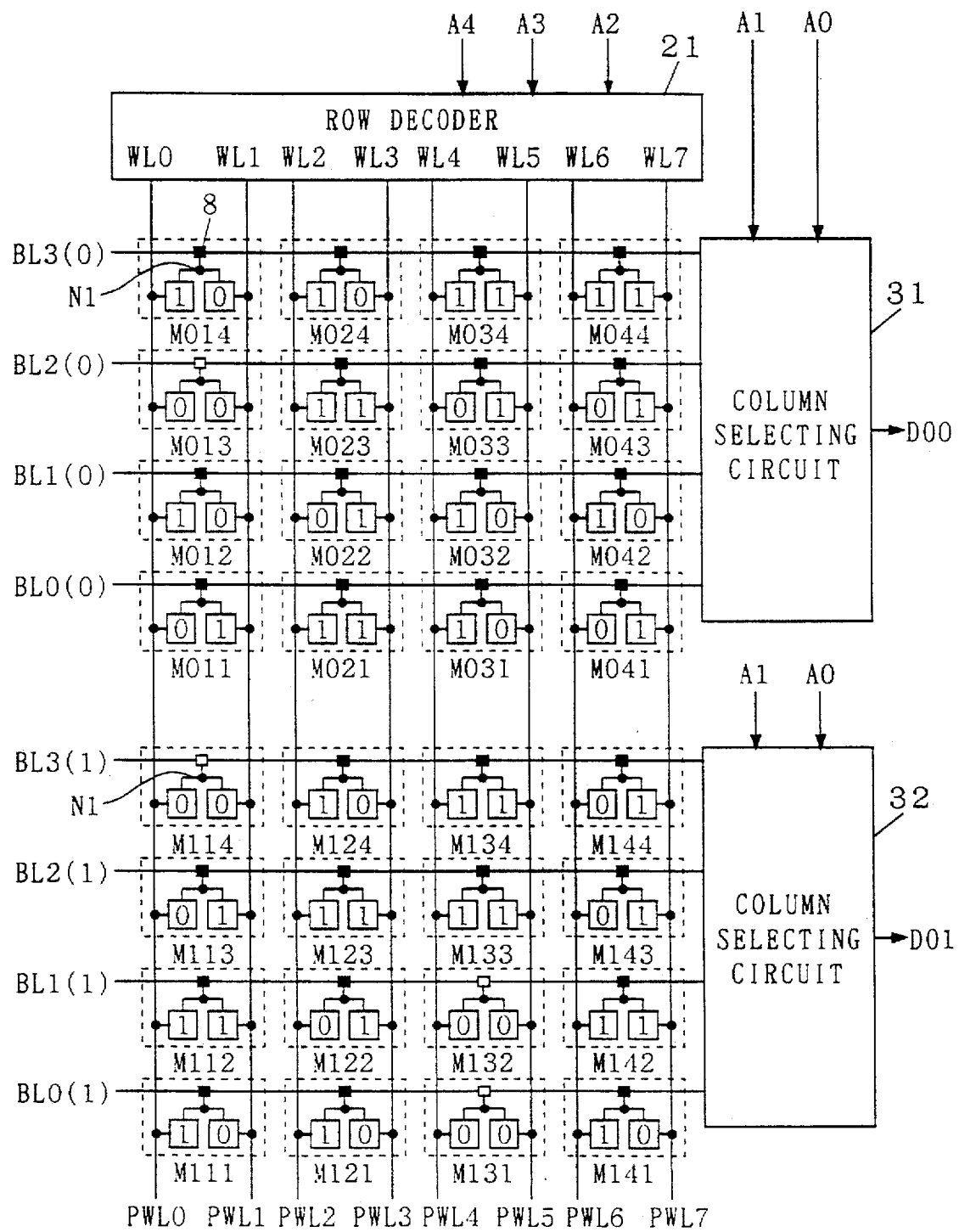
FIG. 16 is a diagram for explaining the operation according to the ninth embodiment of the present invention.

FIG. 16 is a diagram for explaining the status in which the ROM shown in FIG. 15 stores the data shown in Table 1. In FIG. 16, "1" in a square of each memory cell pair represents that information "1" is stored, and "0" represents that information "0" is stored.

As described above, the memory cell pair which stores (0, 0) does not need to connect a common node N1 (N2) to the bit line BL (see FIG. 1A, FIGS. 2A to 2C, FIG. 8A and FIGS. 9A to 9C). Therefore, a contact 8 for electrically connecting the bit line BL to the common node N1 is not formed (shown by ☐). The memory cell pair which stores contents other than (0, 0) needs to connect the common node N1 (N2) to the bit line BL. Therefore, the contact 8 for electrically connecting the bit line BL to the common node N1 is formed.

As the number of the memory cell pairs to which (0, 0) is written is increased, that is, the number of the contacts 8 to be connected to the bit line BL is decreased, a load applied to the bit line BL is reduced. Consequently, the read speed of the ROM can be enhanced and the consumed power can be reduced. With the structure of a memory cell array shown in FIG. 16, the maximum number of the contacts 8 is 4 for each bit line, and the total number is 28.

{Operation of row selection content deciding means 14'}

The row selection content deciding means 14' of the layout/circuit information generating apparatus according to the ninth embodiment aims at the stored data per word line WL in order to decrease the number of the contacts 8 connected to the bit line BL, and decides the decode output order (word line selection contents) such that the word lines WL having a high degree in which write data in the same column are coincident with each other form a group of the word lines WL connected to the memory cell pairs in the same row.

For example, the write data in columns corresponding to the word lines WL0 and WL6 are completely coincident with each other in the ROM having the structure shown in FIG. 16. Consequently, the decode output order is decided such that the word lines WL0 and WL6 are in the same row as shown in FIG. 17.

Figure 17:
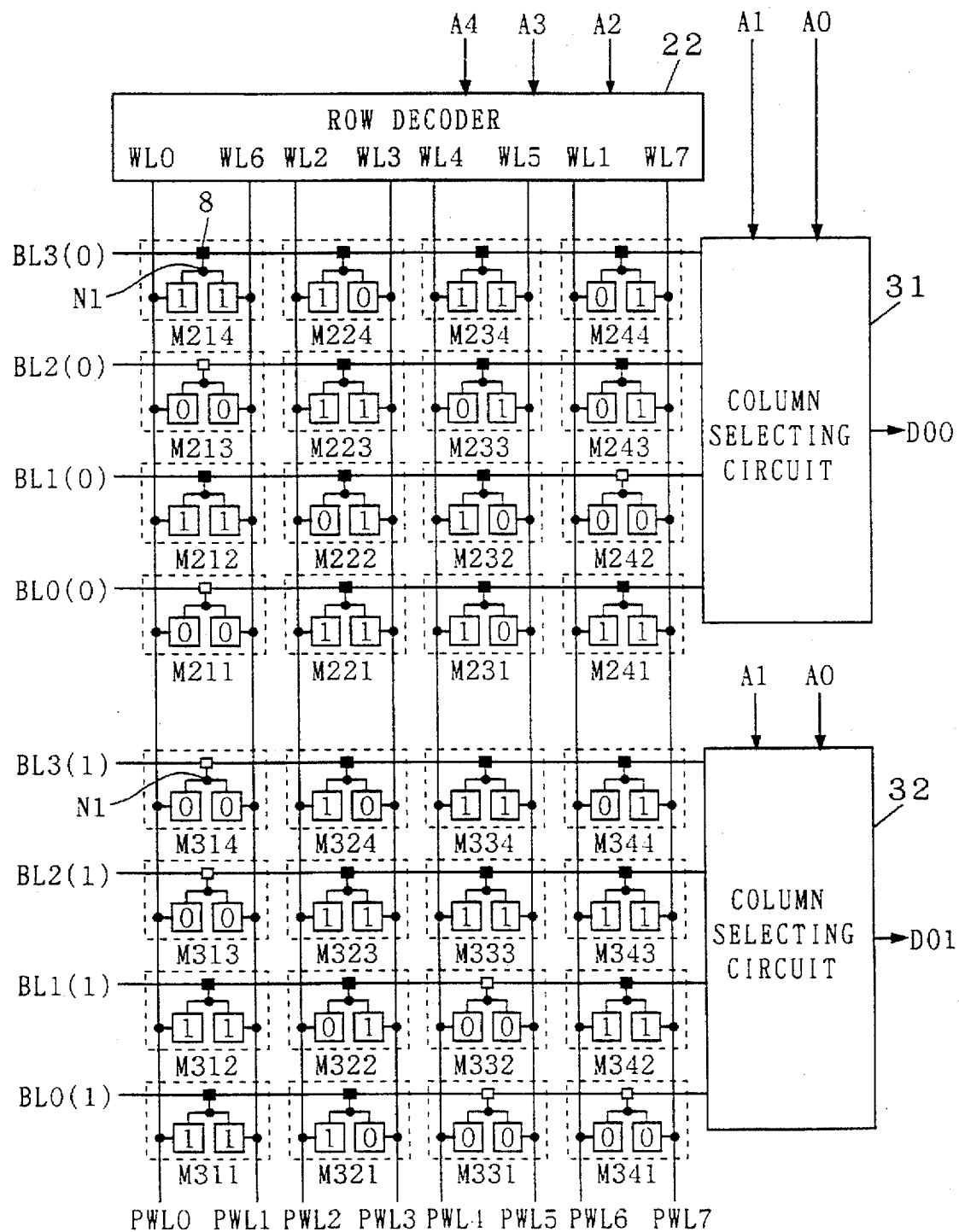
FIG. 17 is a diagram for explaining the operation according to the ninth embodiment of the present invention.

As shown in FIG. 17, 4×4 memory cell pairs M211 to M214, M221 to M224, M231 to M234, and M241 to M244 are selected by a row decoder 22 and the column selecting circuit 31 to send a data output D00. 4×4 memory cell pairs M311 to M314, M321 to M324, M331 to M334, and M341 to M344 are selected by the row decoder 22 and the column selecting circuit 32 to send a data output D01.

With the structure of a memory cell array shown in FIG. 17, the maximum number of the contacts 8 is 4 for each bit line, and the total number is 24. As compared with the structure shown in FIG. 16, the total number is decreased by 4.

The row selection content deciding means 14' sequentially decides the decode output order (word line selection contents) such that any of the word lines WL1 to WL5 and WL 7 having a high degree in which the write data in the same column are coincident with each other form a group of the word lines WL connected to the memory cell pairs in the same row except for the word lines WL0 and WL6 forming the similar (same) pair in order to further decrease the number of the contacts 8 connected to the bit lines BL.

Figure 18:
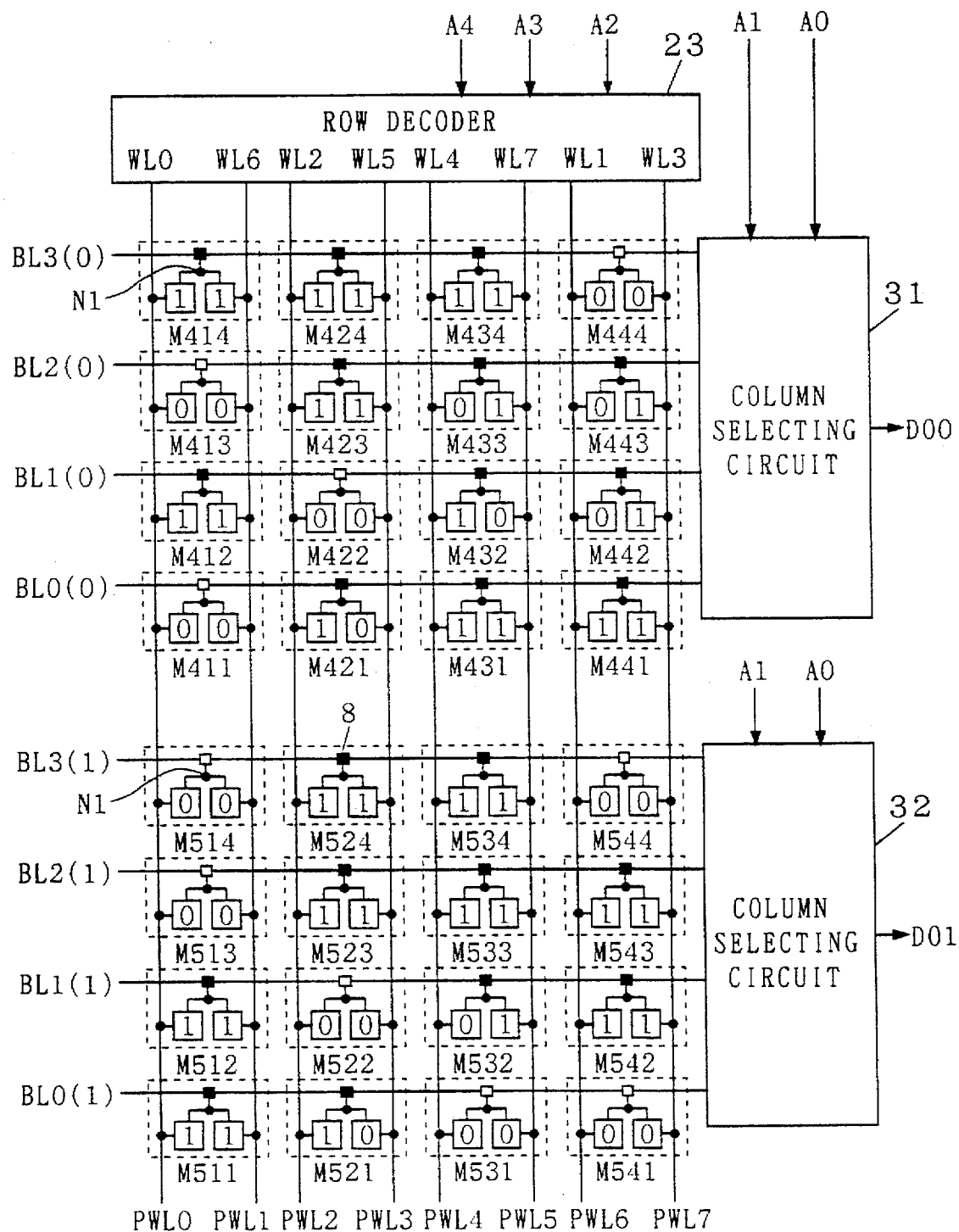
FIG. 18 is a diagram for explaining the operation according to the ninth embodiment of the present invention.

As a result, the row selection content deciding means 14' decides the decode output order (word line selection contents) to output row selection information D6' such that the word lines WL2 and WL5, the word lines WL4 and WL7 and the word lines WL1 and WL3 finally act as similar pairs to form groups of the word lines WL connected to the memory cell pairs in the same row as shown in FIG. 18.

As shown in FIG. 18, 4×4 memory cell pairs M411 to M414, M421 to M424, M431 to M434, and M441 to M444 are selected by a row decoder 23 and a column selecting circuit 31 to send a data output D00. 4×4 memory cell pairs M511 to M514, M521 to M524, M531 to M534, and M541 to M544 are selected by the row decoder 23 and a column selecting circuit 32 to send a data output D01.

With the structure of a memory cell array shown in FIG. 18, the maximum number of the contacts 8 is 3 for each bit line, and the total number is 22. As compared with the structure shown in FIG. 16, the maximum number for each bit line is decreased by 1 and the total number is decreased by 6.

Thus, the row selection content deciding means 14' of the layout/circuit information generating apparatus according to the ninth embodiment decides the physical arrangement of the word lines (decode output order) to output the row selection information D6' such that the word lines having a high degree in which the write data in the same row are coincident with each other form a group of the word lines in the same row.

Accordingly, the ROM which is defined by the ROM layout/circuit information D9 generated by the layout/circuit information synthesizing means 17 reflects the row selection information D6'. Consequently, a capacity which is incidental to each bit line can be reduced as much as possible. Thus, a circuit structure can be obtained in which speed is increased and the consumed power is reduced.

{Operation of memory cell array generating means 16" and peripheral circuit generating means 15'}

As another method for decreasing the number of the contacts 8 for connection to the bit lines BL, each bit line BL is aimed at to provide a column selecting circuit. In this method, when the number of the memory cell pairs for storing (1, 1) is equal to or more than half of the number of all memory cell pairs connected to the bit lines BL, all write data of the memory cell pairs connected to the bit lines BL are inverted, and signals obtained from the bit lines BL are inverted and output.

Based on the ROM code D1 and the memory cell array information D2, the memory cell array generating means 16" outputs, to the peripheral circuit generating means 15', inverted column information D10 which defines the bit lines (to be inverted), or an inverted column judging that the number of the memory cell pairs for storing (1, 1) is equal to or more than half of the number of all the memory cell pairs connected to the bit lines BL and is relatively great, and converts, into inverted data, all the write data in the inverted column corresponding to the bit line to be inverted to output memory cell array layout/circuit information D8".

The peripheral circuit generating means 15' generates peripheral circuit layout/circuit information D7' on the basis of the memory cell array information D2, the row selection information D6' and the inverted column information D10. The peripheral circuit layout/circuit information D7' includes information which defines a row decoder for deciding the decode output order based on the row selection information D6' and a column selecting circuit for inverting a signal obtained from a bit line BL in the column indicated by the inverted column information D10 and outputting the inverted signal to the outside, respectively.

Figure 19:
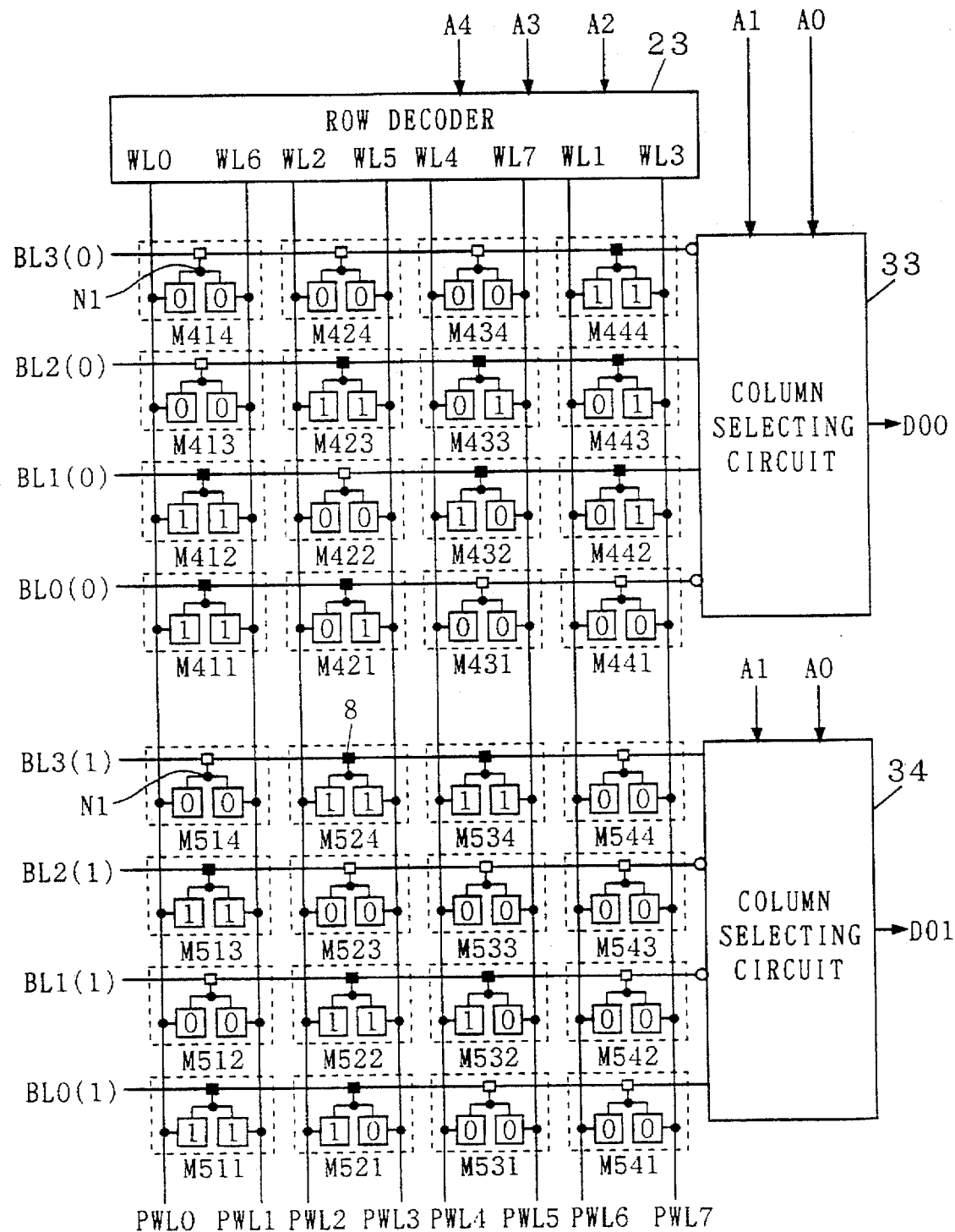
FIG. 19 is a diagram for explaining the operation according to the ninth embodiment of the present invention.
Figure 20:
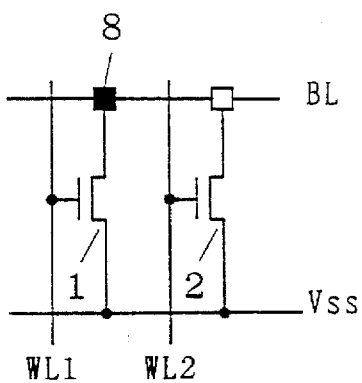
FIG. 20 is a circuit diagram showing the structure of a memory cell of a ROM according to the prior art.
Figure 21A:
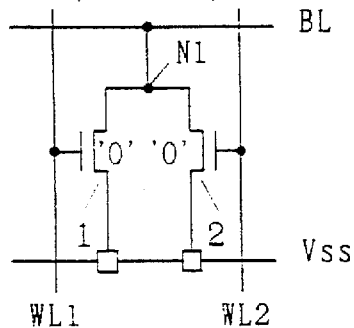
FIGS. 21A to 21D are circuit diagrams showing the structure of a memory cell pair of the ROM according to the prior art
Figure 21B:
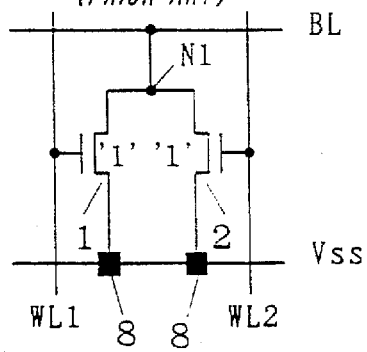
Figure 21C:
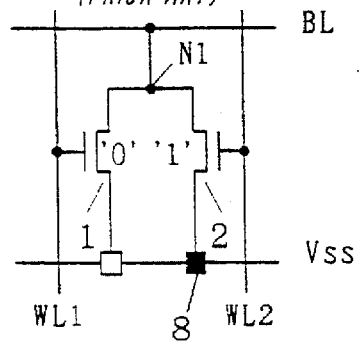
Figure 21D:
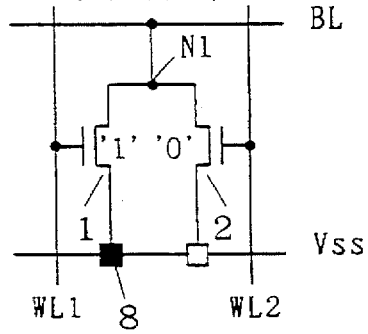

FIG. 19 shows an example in which column selecting circuits 33 and 34 are provided. The column selecting circuits 33 and 34 serve to invert all the write data of the memory cell pairs for the bit lines BL3(0), BL0(0), BL2(1) and BL1(1) shown in FIG. 18, and to invert the signals obtained from the bit lines BL and output the inverted signals.

As shown in FIG. 19, 4×4 memory cell pairs M411 to M414, M421 to M424, M431 to M434, and M441 to M444 are selected by a row decoder 23 and the column selecting circuit 33 to send a data output D00. 4×4 memory cell pairs M511 to M514, M521 to M524, M531 to M534, and M541 to M544 are selected by the row decoder 23 and the column selecting circuit 32 to send a data output D01.

The write data of memory cell pairs M4i1 (i=1 to 4), M4i4, M5i3 and M5i2 are inverted, respectively.

With the structure of a memory cell array shown in FIG. 19, the total number of the contacts 8 is 16. As compared with the structure shown in FIG. 16, the maximum number for each bit line is decreased by 1, and the total number is decreased by 12.

Thus, the memory cell array generating means 16" of the layout/circuit information generating apparatus according to the ninth embodiment outputs the inverted column information D10 that defines bit line (the inverted column) whose number is greater than that of all the memory cell pairs connected to the bit lines BL.

Accordingly, the ROM defined by the ROM layout/circuit information D9 which is finally generated by the layout/circuit information synthesizing means 17 reflects the inverted column information D10 and increases the number of the memory cell pairs which store (0, 0). Consequently, the capacity which is incidental to each bit line is reduced more. Thus, a circuit structure can be obtained in which speed is increased and the consumed power is reduced.

While the case where the number of the memory cell pairs which store (1, 1) is equal to or more than half of that of the memory cell pairs of all the bit lines is specified as the criterion of judging that the number of the memory cell pairs which store (1, 1) is comparatively great in the present embodiment, the present invention is not restricted thereto. If a decrease in the number of the contacts 8 provided on the bit line BL can be expected, the criterion may be set to the case where there are memory cell pairs for storing (1, 1) whose number is equal to or more than the number with which the decrease can be expected.

{Conclusion}

Based on the ROM code D1 and the memory cell array information D2, the row selection content deciding means 14' of the layout/circuit information generating apparatus decides the decode output order of each word line to output the row selection information D6' such that the word lines having a high degree in which the write data in the same column are coincident with each other are the word lines in the same row.

Based on the ROM code D1 and the memory cell array information D2, the memory cell array generating means 16" outputs, to the peripheral circuit generating means 15', the inverted column information D10 that defines the bit lines (the inverted column) in which the number of the memory cell pairs for storing (1, 1) is relatively great, and converts, into inverted data, all the write data in the inverted column to output the memory cell array layout/circuit information D8".

The peripheral circuit generating means 15' receives the memory cell array information D2, the row selection information D6' and the inversion column information D10 to output the layout/circuit information D7' of a peripheral circuit including the row decoder for deciding the decode output order on the basis of the row selection information D6', and the column selecting circuit for inverting the signal obtained from the bit line BL designated by the inverted column information D10 and outputting the inverted signal to the outside.

Finally, the layout/circuit information synthesizing means 17 synthesizes the peripheral circuit layout/circuit information D7' and the memory cell array layout/circuit information D8" to generate the ROM layout/circuit information D9 which defines the layout/circuit of the whole ROM on the basis of the information D7' and D8".

The ROM defined by the ROM layout/circuit information D9 which is obtained as described above reflects the row selection information D6' and the inverted column information D10. Consequently, the capacity which is incidental to each bit line can be reduced greatly. Thus, a circuit structure can be obtained in which the speed is increased and the consumed power is reduced still more.

While the invention has been described in detail, the foregoing description is in all aspects illustrative and not restrictive. It is understood that numerous other modifications and variations can be devised without departing from the scope of the invention.

We claim:

1. A semiconductor memory comprising:
    a bit line;
    a first word line;
    a second word line;
    a power line for supplying a predetermined source voltage;
    a first transistor having a control electrode connected to said first word line, a first electrode connected to a common node, and a second electrode; and
    a second transistor having a control electrode connected to said second word line, a first electrode connected to said common node, and a second electrode, said first and second transistors forming a memory cell pair,
    wherein 2-bit information can be written to said memory cell pair by setting connection/non-connection between said common node and said bit line, and connection/non-connection between each second electrode of said first and second transistors and said power line.

2. The semiconductor memory as defined in claim 1, wherein the second electrode of at least one of said first and second transistors is connected to said power line if non-connection is set between said common node and said bit line.

3. The semiconductor memory as defined in claim 1, further comprising:
    a second bit line;
    a third transistor having a control electrode connected to said first word line, a first electrode connected to a second common node, and a second electrode; and
    a fourth transistor having a control electrode connected to said second word line, a first electrode connected to said second common node, and a second electrode, said third and fourth transistors forming a second memory cell pair,
    wherein 2-bit information can be written to said second memory cell pair by setting connection/non-connection between said second common node and said second bit line, and connection/non-connection between each of the second electrodes of said third and fourth transistors and said power line.

4. A semiconductor memory comprising:
    a bit line;
    a first word line;
    a second word line;
    a power line for supplying a predetermined source voltage;
    a first transistor having a first electrode connected to a common node, a second electrode connected to said power line, and a control electrode; and
    a second transistor having a first electrode connected to said common node, a second electrode connected to said power line, and a control electrode, said first and second transistors forming a memory cell pair,
    wherein 2-bit information can be written to said memory cell pair by setting connection/non-connection between said common node and said bit line, connection/non-connection between the control electrode of said first transistor and said first word line, and connection/non-connection between the control electrode of said second transistor and said second word line, and
    wherein the control electrode of at least one of said first and second transistors is brought into a floating state if non-connection is set between said common node and said bit line.

5. The semiconductor memory as defined in claim 4, further comprising:
    a second bit line;
    a third transistor having a first electrode connected to a second common node, a second electrode connected to said power line, and a control electrode; and
    a fourth transistor having a first electrode connected to said second common node, a second electrode connected to said power line, and a control electrode, said third and fourth transistors forming a second memory cell pair,
    wherein 2-bit information can be written to said second memory cell pair by setting connection/non-connection between said second common node and said second bit line, connection/non-connection between the control electrode of said third transistor and said first word line, and connection/non-connection between the control electrode of said fourth transistor and said second word line.

6. An apparatus for generating layout/circuit information including the circuit information and layout information of a semiconductor memory having a memory cell pair group in which memory cell pairs are arranged in a matrix having N rows×M columns (N≧2, M≧1), said semiconductor memory being the semiconductor memory as defined in claim 1, or a semiconductor memory comprising a bit line, a first word line, a second word line, a power line for supplying a predetermined source voltage, a first transistor having a first electrode connected to a common node, a second electrode connected to said power line, and a control electrode, and a second transistor having a first electrode connected to said common node, a second electrode connected to said power line, and a control electrode, said first and second transistors forming a memory cell pair, wherein 2-bit information can be written to said memory cell pair by setting connection/non-connection between said common node and said bit line, connection/non-connection between the control electrode of said first transistor and said first word line, and connection/non-connection between the control electrode of said second transistor and said second word line, said apparatus for generating layout/circuit information comprising:

write information providing means for providing write information to said memory cell pair group of said semiconductor memory;

memory cell array information providing means for providing memory cell array information including the number (N.M) of said memory cell pairs which form said memory cell pair group, the number (M) of bit lines, the number (N) of first and second word lines, and the number (M) of power lines;

word line physical arrangement generating means for deciding the physical arrangement of said N first and second word lines to generate word line selection information on the basis of said write information and said memory cell array information such that capacities incidental to said M bit lines are decreased;

memory cell array layout/circuit information generating means for generating memory cell array layout/circuit information which defines the circuit structure of a memory cell array including said memory cell pair group, said M bit lines, said N first and second word lines, and said M power lines on the basis of said write information, said memory cell array information and said word line selection information;

peripheral circuit information generating means for generating peripheral circuit information including word line selection layout/circuit information which defines a word line selecting circuit for selecting said N first and second word lines on the basis of said memory cell array information and said word line selection information; and layout/circuit information generating means for generating the layout/circuit information of said semiconductor memory on the basis of said memory cell array layout/circuit information and said peripheral circuit information.

7. The semiconductor memory as defined in claim 6, wherein said word line physical arrangement generating means decides said physical arrangement of said N first and second word lines to generate said word line selection information such that word lines having a high degree in which write data in the same column are coincident with each other are first and second word lines in the same row.

8. The semiconductor memory as defined in claim 7, wherein said word lines having a high degree in which said write data in the same column are coincident with each other include word lines in which all write data in the same column are coincident with one another.

9. The semiconductor memory as defined in claim 6, wherein said memory cell array layout/circuit information generating means converts all write data in an inverted column of M columns into inverted data to output said memory cell array layout/circuit information, and outputs an inverted column information for indicating said inverted column, said inverted column having a relatively great number of memory cell pairs both of which store data for indicating the connection between said common node and said bit line, wherein said peripheral circuit information includes bit line selection layout/circuit information which defines a bit line selecting circuit for selecting said M bit lines, and wherein said peripheral circuit information generating means further receives said inverted column information, and outputs said bit line selection layout/circuit information which defines said bit line selecting circuit that can invert and output data obtained from any of said M bit lines corresponding to said inverted column to output inverted data.

* * * * *